(12) United States Patent
Han et al.

(10) Patent No.: US 11,424,329 B2
(45) Date of Patent: Aug. 23, 2022

(54) SEMICONDUCTOR DEVICE INCLUDING INDIUM, SILICON AND CARBON WITH VARYING CONCENTRATIONS

(71) Applicant: SUZHOU LEKIN SEMICONDUCTOR CO., LTD., Taicang (CN)

(72) Inventors: Dae Seob Han, Seoul (KR); Kwang Sun Baek, Seoul (KR); Young Suk Song, Seoul (KR)

(73) Assignee: SUZHOU LEKIN SEMICONDUCTOR CO., LTD., Taicang (CN)

( * ) Notice: Subject to any disclaimer, the term of this patent is extended or adjusted under 35 U.S.C. 154(b) by 197 days.

(21) Appl. No.: 16/769,695

(22) PCT Filed: Dec. 21, 2018

(86) PCT No.: PCT/KR2018/016467
§ 371 (c)(1),
(2) Date: Jun. 4, 2020

(87) PCT Pub. No.: WO2019/125049
PCT Pub. Date: Jun. 27, 2019

(65) Prior Publication Data
US 2021/0367041 A1 Nov. 25, 2021

(30) Foreign Application Priority Data
Dec. 22, 2017 (KR) .......................... 10-2017-0177663

(51) Int. Cl.
*H01L 29/36* (2006.01)
*H01L 33/02* (2010.01)

(52) U.S. Cl.
CPC ............ *H01L 29/36* (2013.01); *H01L 33/025* (2013.01)

(58) Field of Classification Search
CPC .............................. H01L 29/36; H01L 33/025
USPC .................................................. 257/101, 655
See application file for complete search history.

(56) References Cited

U.S. PATENT DOCUMENTS

| 2008/0137701 | A1 | 6/2008 | Freund | |
|---|---|---|---|---|
| 2011/0133156 | A1 | 6/2011 | Won et al. | |
| 2011/0309447 | A1* | 12/2011 | Arghavani | H01L 29/6659 257/E27.06 |
| 2018/0062039 | A1 | 3/2018 | Fujiwara | |

FOREIGN PATENT DOCUMENTS

| JP | 2016-181559 A | 10/2016 |
|---|---|---|
| KR | 10-0993085 B1 | 11/2010 |
| KR | 10-2013-0067821 A | 6/2013 |
| KR | 10-2014-0142842 A | 12/2014 |
| KR | 10-2016-0105177 A | 9/2016 |

* cited by examiner

*Primary Examiner* — Ajay Arora
(74) *Attorney, Agent, or Firm* — Birch, Stewart, Kolasch & Birch, LLP

(57) ABSTRACT

A semiconductor device including first to fourth points defined using In ion intensity, Si concentration, and C concentration obtained from SIMS data. The active layer of the device is a first region between the first point and the second point. In addition, the C concentration in a third region between the third point and the fourth point is higher than the C concentration in a second region adjacent to the fourth region along a second direction. Also, the Si concentration in the second region is higher than the Si concentration in the third region.

9 Claims, 6 Drawing Sheets

SEMICONDUCTOR DEVICE INCLUDING INDIUM, SILICON AND CARBON WITH VARYING CONCENTRATIONS

CROSS REFERENCE TO RELATED APPLICATIONS

This application is the National Phase of PCT International Application No. PCT/KR2018/016467, filed on Dec. 21, 2018, which claims priority under 35 U.S.C. 119(a) to Patent Application No. 10-2017-0177663, filed in the Republic of Korea on Dec. 22, 2017, all of which are hereby expressly incorporated by reference into the present application.

FIELD

An embodiment relates to a semiconductor device.

DESCRIPTION OF RELATED ART

A semiconductor device containing a compound such as GaN, AlGaN, etc. may have many advantages such as a wide and easily adjustable band gap energy and thus may be used as a light-emitting device, a light-receiving device, and various diodes.

In particular, a light-emitting device such as a light-emitting diode, or a laser diode using a group III-V compound semiconductor or a group II-VI compound semiconductor may render various colors such as red, green, blue, and ultraviolet light due to development of a thin-film growth technology and new device materials. The light-emitting device may realize an efficient white light beam using a fluorescent material or by combining colors. The light-emitting device may have advantages of low power consumption, semi-permanent lifespan, fast response speed, safety, and environment friendliness, compared to conventional light-sources such as fluorescent and incandescent lamps.

For example, a nitride semiconductor for the light-emitting device has a high thermal stability and a wide bandgap energy, and thus is in the spotlight for developing an optical device and a high-power electronic device. In particular, a blue light-emitting device, a green light-emitting device, an ultraviolet (UV) light-emitting device, and a red light-emitting device using the nitride semiconductor are commercially available and widely used.

Recently, as a demand for a high-efficiency LED has increased, luminous intensity improvement has been a challenge. However, satisfactory improvement in the luminous intensity has not yet been achieved.

SUMMARY

An embodiment provides a semiconductor device in which luminous intensity may be increased.

An embodiment provides a semiconductor device that does not require an additional component to increase the luminous intensity.

A semiconductor device in accordance with an embodiment includes a first conductive-type semiconductor layer; a second conductive-type semiconductor layer disposed over the first conductive-type semiconductor layer; and an active layer disposed between the first conductive-type semiconductor layer and the second conductive-type semiconductor layer.

When primary ions are irradiated to the first conductive-type semiconductor layer, the active layer, and the second conductive-type semiconductor layer, secondary ions are emitted from the first conductive-type semiconductor layer, the active layer, and the second conductive-type semiconductor layer. An indium (In) ion intensity, a silicon (Si) concentration, and a carbon (C) concentration of the first conductive-type semiconductor layer, the active layer, and the second conductive-type semiconductor layer are detected based on the emitted secondary ions.

The semiconductor device has a plurality of inflection points of the indium (In) ion intensity, wherein the indium (In) ion intensities at the plurality of inflection points are 0.3 to 0.5 times of a highest indium (In) ion intensity in a vertical entire region of the semiconductor device, wherein the semiconductor device has: a first point having the same indium (In) ion intensity as a lowest indium (In) ion intensity among the indium (In) ion intensities at the plurality of inflection points, wherein the first point is adjacent to a location having a lowest indium (In) ion intensity in a direction toward a first vertical end of the semiconductor device; a second point having the same indium (In) ion intensity as a lowest indium (In) ion intensity among the indium (In) ion intensities at the plurality of inflection points, wherein the second point is closest to a location having a lowest indium (In) ion intensity in a direction toward a second vertical end of the semiconductor device, wherein the first and second vertical ends are opposite to each other; a third point having the same indium (In) ion intensity as an indium (In) ion intensity of a highest peak among at least one peak, wherein at least one point having the at least one peak respectively is spaced from the second point in a direction toward the second vertical end, wherein the third point is closest to a location having a peak of a highest indium (In) ion intensity in a direction toward the first vertical end of the semiconductor device; and a fourth point present in a partial region where the Si concentration is lower than a highest Si concentration in a vertical entire region of the semiconductor device, wherein the fourth point has a highest Si concentration in the partial region, wherein the fourth point is adjacent to a location having a highest Si concentration in a direction toward the second vertical end of the semiconductor device.

The active layer corresponds to a first region between the first point and the second point.

The first conductive-type semiconductor layer includes a first layer and a second layer, wherein the first layer corresponds to a second region containing a point having a highest Si concentration, wherein the second layer corresponds to a third region between the third point and the fourth point.

The C concentration in the third region is higher than the C concentration in the second region. The Si concentration in the second region is higher than the Si concentration in the third region.

According to the embodiment, a structure of the semiconductor device may be grasped easily based on SIMS data analysis.

According to the embodiment, the SIMS data analysis may allow a process to be controlled such that a semiconductor material is accurately doped into each layer at a target concentration.

According to the embodiment, the SIMS data analysis may allow a process to be controlled such that a micro shape such as a V-pit shape of the semiconductor device is accurately formed.

According to the embodiment, the SIMS data analysis may allow a process to be controlled such that a target thickness of each layer of the semiconductor device is accurately achieved.

According to the embodiment, adjusting the temperature, the thickness, and the indium (In) content may allow a recess such as a V-pit extending to the active layer and the p-type semiconductor layer to be formed. Further, a size of the recess and an arrangement density of the recesses may be precisely adjusted such that light from the active layer may be easily extracted through an inclined face of the recess, and a hole of the p-type semiconductor layer may be easily injected into the active layer through the recess, resulting in improved light efficiency. The luminous intensity may be increased due to the improvement of light extraction efficiency, and light efficiency.

According to the embodiment, adjusting the temperature among the temperature, the thickness, and the indium (In) content may allow the formation of a dual type recess in which a width of an upper recess is larger than a width of a lower recess, such that the luminous intensity may be further increased.

According to the embodiment, the carbon concentration related to electrical resistance is increased due to the temperature adjustment for the expansion of the width of the upper recess. In this connection, the increase in the electrical resistance due to the increase in the carbon concentration may be cancelled by increasing the Si concentration. Thus, the electrical and optical properties may be increased or may be maintained.

DETAILED DESCRIPTIONS

Figure 1:
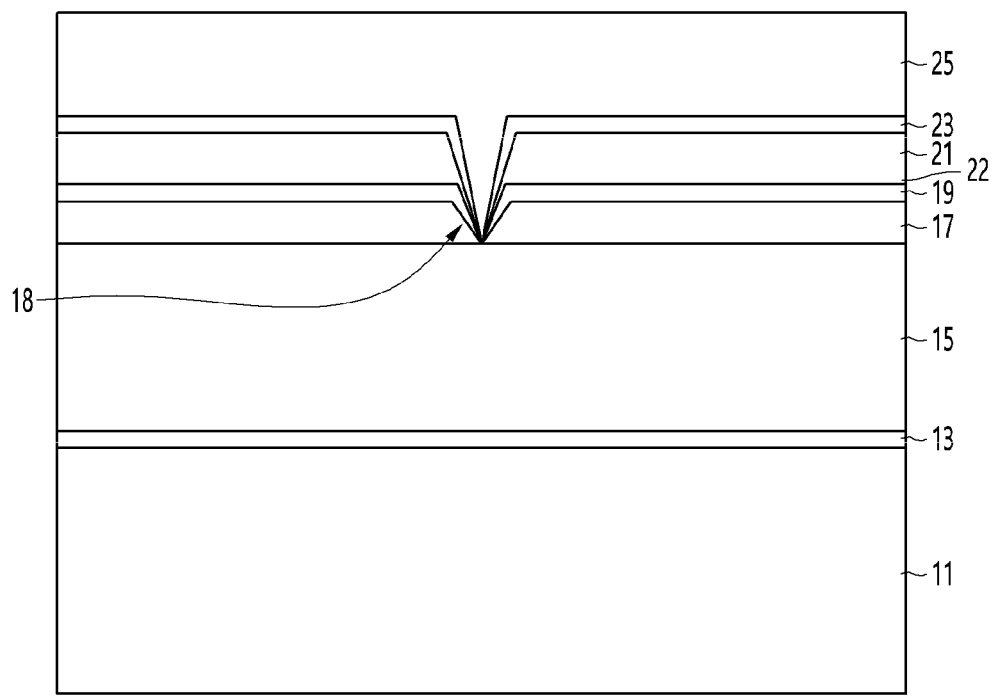
FIG. 1 shows a semiconductor device according to a first embodiment.

Hereinafter, preferred embodiments of the present disclosure will be described in detail with reference to the accompanying drawings. However, the technical idea of the present disclosure is not limited to some embodiments as described, but may be implemented in various different forms. At least one of components in one embodiment may be selectively combined with or substituted with at least one of components in another embodiment, within the technical idea range of the present disclosure. Further, the terms used in the embodiment of the present disclosure (including technical and scientific terms) have meanings that may be generally understood by those of ordinary skill in the technical field to which the present disclosure belongs, unless explicitly defined and described. Commonly used terms such as terms defined in dictionaries may be interpreted with considering contextual meaning thereof in the related art. Further, the term used in the embodiment of the present disclosure is intended for describing embodiments and is not intended to limit the present disclosure. As used herein, the singular forms "a" and "an" are intended to include the plural forms as well, unless the context clearly indicates otherwise. As used herein, the term "and/or" includes any and all combinations of at least one of the associated listed items. Expression such as "at least one of" when preceding a list of elements may modify the entire list of elements and may not modify the individual elements of the list. It will be understood that, although the terms "first", "second", "third" and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure. It will be understood that when an element or layer is referred to as being "connected to", or "coupled to" another element or layer, it may be directly on, connected to, or coupled to the other element or layer, or at least one intervening elements or layers may be present. In addition, it will also be understood that when an element or layer is referred to as being "between" two elements or layers, it may be the only element or layer between the two elements or layers, or at least one intervening elements or layers may also be present. In addition, it will also be understood that when a first element or layer is referred to as being present "on" or "beneath" a second element or layer, the first element may be disposed directly on or beneath the second element or may be disposed indirectly on or beneath the second element with a third element or layer being disposed between the first and second elements or layers.

Hereinafter, an embodiment for solving the above problems will be described with reference to the accompanying drawings.

Further, as used herein, when an element is disposed "on" or "on a top" of another element, the former may directly contact the latter or still another element may be disposed between the former and the latter. As used herein, when an element is directly disposed "on" or "on a top" of another element, the former directly contacts the latter and still another element is not disposed between the former and the latter. Further, as used herein, when an element is disposed "below" or "under" another element, the former may directly contact the latter or still another element may be disposed between the former and the latter. As used herein, when an element is directly disposed "below" or "under" another element, the former directly contacts the latter and still another element is not disposed between the former and the latter.

The semiconductor device may include various electronic devices including light-emitting devices and light-receiving devices. Each of the light-emitting device and the light-receiving device may include a semiconductor structure including at least a first semiconductor layer, an active layer, and a second semiconductor layer. The semiconductor device according to an embodiment may be a light-emitting device. The light-emitting device may emit light via recombination between first carriers, that is, electrons and second carriers, that is, holes. A wavelength of the light may be determined based on a bandgap energy inherent to a material. Therefore, the emitted light may vary depending on a composition of the material.

The light-emitting device may be referred to as a semiconductor light-emitting device.

The terms may be interchanged between the claims and the following description as follows.

A first conductive-type semiconductor layer may include a first layer, a second layer, a third layer, and a fourth layer. The first layer may be a first semiconductor layer 15, the second layer may be a third semiconductor layer 17, the third layer may be a fourth semiconductor layer 19, and the fourth layer may be a fifth semiconductor layer 22. A second conductive-type semiconductor layer may include a first layer, and a second layer. The first layer may be a second semiconductor layer 25, and the second layer may be a sixth semiconductor layer 23.

FIRST EMBODIMENT

Structure of Semiconductor Device

FIG. 1 shows a semiconductor device according to the first embodiment.

Referring to FIG. 1, a semiconductor device 10 according to the first embodiment may include the first semiconductor layer 15, an active layer 21 disposed on the first semiconductor layer 15, and the second semiconductor layer 25 disposed on the active layer 21.

The first semiconductor layer 15, the active layer 21, and the second semiconductor layer 25 may constitute a semiconductor structure. When an electrical signal is supplied to such a semiconductor structure, light corresponding to the electrical signal may be generated, and may be emitted from the semiconductor structure. Intensity of the light may be proportional to intensity of the electrical signal.

The first semiconductor layer 15 may be, for example, an n-type semiconductor layer, and the second semiconductor layer 25 may be a p-type semiconductor layer. However, the present disclosure is not limited thereto. The n-type semiconductor layer may contain a first carrier as a majority carrier. The p-type semiconductor layer may contain a second carrier as a majority carrier.

When an electrical signal is supplied to the semiconductor structure, the first carrier of the first semiconductor layer 15, and the second carrier of the second semiconductor layer 25 may be injected into the active layer 21. In the active layer 21, the second carrier and the first carrier are recombined with each other to emit light of a wavelength region corresponding to a bandgap energy of the active layer 21. The bandgap energy may be determined based on the compound semiconductor material. For example, ultraviolet light or infrared light may be emitted depending on the compound semiconductor material of the active layer 21.

In order to improve electrical and optical properties, at least one layer may be disposed under the semiconductor structure, above the semiconductor structure, and/or within the semiconductor structure.

For example, a buffer layer 13 may be disposed under the first semiconductor layer 15. For example, the third semiconductor layer 17, the fourth semiconductor layer 19, and the fifth semiconductor layer 22 may be disposed between the first semiconductor layer 15 and the active layer 21. For example, the sixth semiconductor layer 23 may be disposed between the active layer 21 and the second semiconductor layer 25.

The third semiconductor layer 17 may be a middle temperature (MT) layer. In this connection, the middle temperature may be a temperature for forming the third semiconductor layer 17. A growth temperature of the third semiconductor layer 17 may be lower than a growth temperature of the first semiconductor layer 15.

In growth of the third semiconductor layer 17, vertical and horizontal growth rates may be controlled by adjusting a temperature, adjusting an indium (In) content, and adjusting a thickness of each sub-semiconductor layer (see 17a, and 17b in FIG. 2), such that recesses 18 may be formed. For example, the recesses 18 may have a V-pit shape.

The recesses 18 may have a size or width that increases as the recess extends from a bottom of the third semiconductor layer 17 to a top thereof.

A lateral face of each of the recesses 18 may have a straight face. However, the present disclosure is not limited thereto.

The fourth semiconductor layer 19 may act as a strain relaxation layer (SRL) or a current spreading layer (CSL). The fourth semiconductor layer 19 may rapidly spread the current along a horizontal direction. The fourth semiconductor layer 19 may relax stress to prevent defects such as cracks in the semiconductor device 10. The fifth semiconductor layer 22 may act as an electron injection layer. The fifth semiconductor layer may easily inject the first carrier generated in the first semiconductor layer 15 into the active layer 21.

The sixth semiconductor layer 23 may act as a carrier blocking layer (EBL). The sixth semiconductor layer 23 may prevent the first carrier injected from the first semiconductor layer 15 to the active layer 21 from passing through the active layer 21 and then moving to the second semiconductor layer 25.

Typically, mobility of the first carrier may be 10 to 1000 times higher than mobility of the second carrier. Therefore, a probability of non-light-emitting type recombination in which the first carrier injected from the first semiconductor layer 15 to the active layer 21 passes through the active layer 21 and then may be injected into the second semiconductor layer 25 and may be recombined with the second carrier therein may be higher than probability of light-emitting type recombination in which the first carrier injected from the first semiconductor layer 15 to the active layer 21 will be recombined with the second carrier injected from the second semiconductor layer 25 to the active layer 21. Thus, as the probability of the non-light-emitting type recombination in which the first carrier injected from the first semiconductor layer 15 to the active layer 21 passes through the active layer 21 and then may be injected into the second semiconductor layer 25 and may be recombined with the second carrier therein is higher, light generation efficiency may be lowered, and eventually the luminous intensity may be lowered.

Therefore, placing the sixth semiconductor layer 23 between the active layer 21 and the second semiconductor layer 25 may disallow the first carrier injected from the first semiconductor layer 15 to the active layer 21 to be moved to the second semiconductor layer 25, such that the luminous intensity may be increased.

These semiconductor layers, that is, the buffer layer 13, the first to fifth semiconductor layers 15, 25, 17, 19, and 23, and the active layer 21 may be disposed over a substrate 11. In other words, the buffer layer 13, the first semiconductor layer 15, the third semiconductor layer 17, the fourth semiconductor layer 19, the active layer 21, the sixth semiconductor layer 23, and the second semiconductor layer 25 may be sequentially grown over the substrate 11 using a deposition process. That is, the substrate 11 may be loaded in a chamber of a deposition apparatus, and then the buffer layer 13, the first semiconductor layer 15, the third semiconductor layer 17, the fourth semiconductor layer 19, the active layer 21, the sixth semiconductor layer 23, and the second semiconductor layer 25 are sequentially grown thereon. In this way, the semiconductor device 10 according to the first embodiment may be manufactured. Subsequently, the substrate 11 may be taken out of the chamber of the deposition apparatus.

The deposition apparatus may include, for example, a MOCVD (Metal Organic Chemical Vapor Deposition) apparatus, a CVD (Chemical Vapor Deposition) apparatus, a PECVD (Plasma-Enhanced Chemical Vapor Deposition) apparatus, a MBE (Molecular Beam Epitaxy) apparatus, and a HVPE (Hydride Vapor Phase Epitaxy) apparatus. However, the present disclosure is not limited thereto.

Material Characteristics of Semiconductor Device 10

Over the substrate 11, the buffer layer 13, the first semiconductor layer 15, the third semiconductor layer 17, the fourth semiconductor layer 19, the fifth semiconductor layer 22, the active layer 21, the sixth semiconductor layer 23, and the second semiconductor layer 25 may be grown. The substrate may support the buffer layer 13, the first semiconductor layer 15, the third semiconductor layer 17, the fourth semiconductor layer 19, the fifth semiconductor layer 22, the active layer 21, the sixth semiconductor layer 23, and the second semiconductor layer 25 thereon.

To those ends, the substrate 11 may be made of a material suitable for growth of a group III-V compound semiconductor material or a group II-VI compound semiconductor material. The substrate 11 may be made of, for example, a material having at least thermal stability, and a similar lattice constant to that of the first semiconductor layer 15.

For example, the substrate 11 may be a conductive substrate or an insulating substrate. For example, the substrate 11 may be made of at least one selected from a group consisting of sapphire ($Al_2O_3$), SiC, Si, GaAs, GaN, ZnO, GaP, InP, and Ge.

The buffer layer 13 may be disposed on the substrate 11. The buffer layer 13 may play a role in reducing a difference between lattice constants of the substrate 11 and the first semiconductor layer 15. Since the difference between the lattice constants of the substrate 11 and the first semiconductor layer 15 is reduced using the buffer layer 13, the first semiconductor layer 15, the third semiconductor layer 17, the fourth semiconductor layer 19, the fifth semiconductor layer 22, the active layer 21, the sixth semiconductor layer 23, and the second semiconductor layer 25 may be stably grown on the substrate 11 while defects are not created. The buffer layer 13 may include a group III-V compound semiconductor material or a group II-VI compound semiconductor material.

The first semiconductor layer 15 may be disposed on the buffer layer 13. When the buffer layer 13 is omitted, the first semiconductor layer 15 may be disposed on the substrate 11.

The first semiconductor layer 15 may be made of a compound semiconductor material of $Al_xIn_yGa_{(1-x-y)}N$ ($0 \leq x \leq 1$, $0 \leq y \leq 1$, $0 \leq x+y \leq 1$). However, the present disclosure is not limited thereto. For example, the first semiconductor layer 15 may include at least one selected from a group consisting of InAlGaN, GaN, AlGaN, InGaN, AlN, InN, AlInN, GaAs, AlGaAs, GaAsP GaP, InP, GaInP, and AlGaInP. However, the present disclosure is not limited thereto.

The first semiconductor layer 15 may have a thickness of about 1 μm to about 10 μm.

The first semiconductor layer 15 may contain n-type dopants such as Si, Ge, Sn, Se, and Te. A doping concentration thereof, for example, a Si concentration in the first semiconductor layer 15 may be in a range of about $5 \times 10^{18}$ $cm^{-3}$ to about $3 \times 10^{19}$ $cm^{-3}$. In this concentration range, an operation voltage, and an epitaxy quality may be improved.

The first semiconductor layer 15 may feed the first carrier to the active layer 21.

The first semiconductor layer 15 may include carbon (C). A carbon (C) concentration in the first semiconductor layer 15 may be $4 \times 10^{16}$ $cm^{-3}$ or smaller. The operating voltage may be improved in this concentration range.

The third semiconductor layer 17 may be disposed on the first semiconductor layer 15. The fourth semiconductor layer 19 may be disposed on the third semiconductor layer 17.

Each of the third semiconductor layer 17 and the fourth semiconductor layer 19 may be made of a compound semiconductor material of $Al_xIn_yGa_{(1-x-y)}N$ ($0 \leq x \leq 1$, $0 \leq y \leq 1$, $0 \leq x+y \leq 1$). However, the present disclosure is not limited thereto.

Each of the third semiconductor layer 17 and the fourth semiconductor layer 19 may have a superlattice structure composed of a plurality of layers. For example, each of the third semiconductor layer 17 and the fourth semiconductor layer 19 may include an InGaN/GaN stack structure or an InGaN/AlGaN stack structure. However, the present disclosure is not limited thereto.

An indium (In) content of the third semiconductor layer 17 may be in a range of about 1% to about 3%. In this content range, the recess 18 such as the V-pit may be more easily formed, and a film having an uniform thickness may be obtained.

When the fourth semiconductor layer 19 acts as a stress relaxation layer, an indium (In) content therein may be in a range of about 3% to about 6%. The current may be quickly spread in this content range.

When the fourth semiconductor layer 19 acts as the current spreading layer, the indium (In) content therein may be in a range of about 6% to about 12%. The stress may be relaxed in this content range. Further, defects such as cracks may be suppressed in the semiconductor device 10 in this content range.

The fourth semiconductor layer 19 may act as only one of the stress relaxation layer and the current spreading layer. Alternatively, the fourth semiconductor layer 19 may act as both the stress relaxation layer and the current spreading layer.

A thickness of the third semiconductor layer 17 may be in a range of about 130 nm to about 170 nm.

The third semiconductor layer 17 may contain n-type dopants such as Si, Ge, Sn, Se, and Te. A doping concentration, for example, a Si concentration in the third semiconductor layer 17 may be in a range of about $8 \times 10^{17}$ $cm^{-3}$ to about $2 \times 10^{18}$ $cm^{-3}$. In this concentration range, the operation voltage, and the epitaxy quality may be improved.

The fourth semiconductor layer 19 may include n-type dopants such as Si, Ge, Sn, Se, and Te. A doping concentration, for example, a Si concentration in the fourth semiconductor layer 19 may be in a range of about $1 \times 10^{17}$ $cm^{-3}$ to about $1 \times 10^{18}$ $cm^{-3}$. In this concentration range, the operation voltage, and the epitaxy quality may be improved. The third semiconductor layer 17 may contain carbon (C). A carbon concentration in the third semiconductor layer 17 may be in a range of about $4 \times 10^{16}$ $cm^{-3}$ to about $6 \times 10^{16}$ $cm^{-3}$. The operating voltage may be improved in this concentration range.

The fourth semiconductor layer 19 may contain carbon (C). A carbon concentration in the fourth semiconductor layer 19 may be in a range of about $4 \times 10^{16}$ cm$^{-3}$ to $6 \times 10^{16}$ cm$^{-3}$. The operating voltage may be improved in this concentration range.

A ratio between the carbon concentration and the silicon Si concentration in the third semiconductor layer 17 may be in a range of about 1:80 to about 1:200.

When the ratio between the carbon concentration and the silicon concentration is 1:80 or greater, electrical resistance of the carbon may be canceled by the silicon (Si), so that the operation voltage may be improved. When the ratio between the carbon concentration and the silicon concentration is 1:200 or smaller, movement of the first carrier generated in the first semiconductor layer 15 may not be disturbed by the silicon (Si), such that the luminous intensity may be increased.

Although not shown, an electron injection layer that facilitates injection of the first carrier generated in the first semiconductor layer 15 into the active layer 21 may be further disposed between the third semiconductor layer 17 and the active layer 21 or between the fourth semiconductor layer 19 and the active layer 21.

The active layer 21 may be disposed on the first semiconductor layer 15, the third semiconductor layer 17 or the fourth semiconductor layer 19.

The active layer 21 may perform electro luminescence (EL) in which an electrical signal applied across the first semiconductor layer 15 and the second semiconductor layer 25 is converted into light. That is, the active layer 21 may generate light of a specific wavelength region in response to the electrical signal. The light of the specific wavelength region may not be generated by itself but may be generated only when the electrical signal is applied across the first semiconductor layer 15 and the second semiconductor layer 25.

The active layer 21 may include one of a multi-quantum well structure (MQW), a quantum dot structure, or a quantum wire structure. The active layer 21 may include a stack structure in which a well layer and a barrier layer may be repeatedly alternately stacked one on top of the other.

A repeating number of the well layer and the barrier layer may be modified based on characteristics of the semiconductor device 10. However, the present disclosure is not limited thereto. For example, the repeating number of the well layer and the barrier layer may be in a range of 1 to 20. However, the present disclosure is not limited thereto.

The active layer 21 may include the well layer/the barrier layer such as InGaN/InGaN, InGaN/GaN, or InGaN/AlGaN.

An indium (In) content in the active layer 21 may be in a range of about 12% to about 16%. Light of a main light-emitting peak wavelength, for example, blue wavelength light may be generated in the content range.

The well layer may have a thickness of about 1 nm to about 10 nm, and the barrier layer may have a thickness of about 1 nm to about 20 nm.

The active layer 21 may not contain a dopant.

The active layer 21 may contain p-type dopants such as Mg, Zn, Ca, Sr, and Ba. A doping concentration, for example, a magnesium (Mg) concentration in the active layer 21 may be in a range of about $1 \times 10^{17}$ cm$^{-3}$ to about $1 \times 10^{19}$ cm$^{-3}$. Stress of the active layer 21 may be relaxed in this doping concentration range, such that the efficiency of the light generated in the active layer 21 may be improved and the operation voltage may be improved, and light output may be improved. In this connection, the operation voltage may refer to a forward voltage for allowing the light to be generated in the active layer 21. That is, a voltage of positive polarity may be applied to the second semiconductor layer 25, while a voltage of negative polarity may be applied to the first semiconductor layer 15.

The p-type dopant may be contained in the well layer and/or the barrier layer of the active layer 21.

The sixth semiconductor layer 23 may be disposed on the active layer 21. The sixth semiconductor layer 23 may be made of a compound semiconductor material of $Al_xIn_yGa_{(1-x-y)}N$ ($0 \leq x \leq 1$, $0 \leq y \leq 1$, $0 \leq x+y \leq 1$). However, the present disclosure is not limited thereto.

The sixth semiconductor layer 23 may have a superlattice structure composed of a plurality of layers. For example, the sixth semiconductor layer 23 may include a repetition of a stack structure such as a repetition of an AlGaN/GaN stack structure. However, the present disclosure is not limited thereto.

For example, an aluminum (Al) content in the sixth semiconductor layer 23 may be in a range of about 15% to about 24%. In this content range, blocking performance of the first carrier may be improved, and the injection efficiency in which the second carrier of the second semiconductor layer 25 is injected into the active layer 21 may be improved.

The sixth semiconductor layer 23 may contain p-type dopants such as Mg, Zn, Ca, Sr, and Ba. A doping concentration, for example, a magnesium concentration in the sixth semiconductor layer 23 may be in a range of about $5 \times 10^{18}$ cm$^{-3}$ to about $1 \times 10^{20}$ cm$^{-3}$. The operation voltage may be improved, and the light output may be improved in this doping concentration range.

Although not shown, a hole injection layer that facilitates injection of the second carrier generated in the second semiconductor layer 25 into the active layer 21 may be further disposed between the active layer 21 and the sixth semiconductor layer 23. For example, the hole injection layer may include GaN. However, the present disclosure is not limited thereto.

The second semiconductor layer 25 may be disposed on the active layer 21 or the sixth semiconductor layer 23. The second semiconductor layer 25 may feed the second carrier to the active layer 21.

The second semiconductor layer 25 may be made of a compound semiconductor material of $Al_xIn_yGa_{(1-x-y)}N$ ($0 \leq x \leq 1$, $0 \leq y \leq 1$, $0 \leq x+y \leq 1$). However, the present disclosure is not limited thereto. For example, the second semiconductor layer 25 may include at least one selected from a group consisting of InAlGaN, GaN, AlGaN, InGaN, AlN, InN, AlInN, GaAs, AlGaAs, GaAsP GaP, InP, GaInP, and AlGaInP. However, the present disclosure is not limited thereto.

The second semiconductor layer 25 may have a thickness of about 1 μm or smaller.

The second semiconductor layer 25 may contain p-type dopants such as Mg, Zn, Ca, Sr, and Ba. A doping concentration, for example, a magnesium concentration in the second semiconductor layer 25 may be in a range of about $5 \times 10^{18}$ cm$^{-3}$ to about $5 \times 10^{20}$ cm$^{-3}$. The operation voltage may be improved, and the light output may be improved in this doping concentration range.

Detailed Structure of Third Semiconductor Layer

Figure 2:
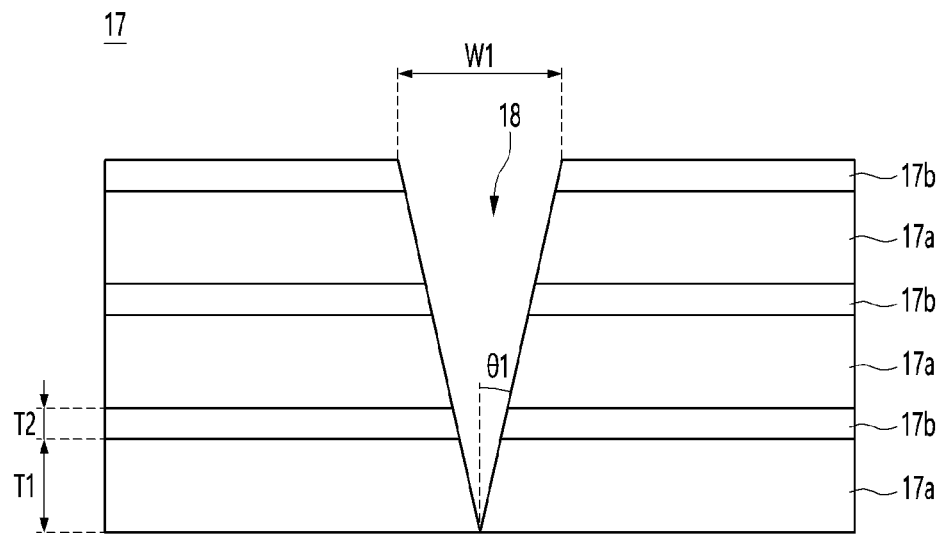
FIG. 2 shows a third semiconductor layer in detail.

FIG. 2 shows the third semiconductor layer in detail.

Referring to FIG. 2, the third semiconductor layer 17 may be composed of a first pair, a second pair, and a third pair. However, the present disclosure is not limited thereto. In other words, the third semiconductor layer 17 may be composed of at least four pairs.

Each of the first pair, the second pair, and the third pair may include a first sub-semiconductor layer 17a and a second sub-semiconductor layer 17b. Accordingly, a top face of the second sub-semiconductor layer 17b of the first pair may be in contact with a bottom face of the first sub-semiconductor layer 17a of the second pair. A top face of the second sub-semiconductor layer 17b of the second pair may contact a bottom face of the first sub-semiconductor layer 17a of the third pair.

For example, a bottom face of the first sub-semiconductor layer 17a of the first pair may be in contact with a top face of the first semiconductor layer 15. A top face of the second sub-semiconductor layer 17b of the third pair may contact a bottom face of the fourth semiconductor layer 19. However, the present disclosure is not limited thereto.

For example, the first sub-semiconductor layer 17a may made of GaN. For example, the second sub-semiconductor layer 17b may be made of InGaN. That is, the indium (In) may be contained in the first sub-semiconductor layer 17a. The indium (In) may not be contained in the second sub-semiconductor layer 17b. Accordingly, the indium (In) may be contained in the third semiconductor layer 17 periodically, for example, on a pair basis.

The third semiconductor layer 17 may be grown on the first semiconductor layer 15 at a temperature of about 830° C. to about 870° C.

For example, in a state in which trimethylgallium (TMG) gas, and nitrogen ($N_2$) gas are injected into the chamber of the MOCVD apparatus, the indium (In) may be periodically injected thereto. Thus, the first sub-semiconductor layers 17a, and the second sub-semiconductor layer 17b of each of the first pair, the second pair, and the third pair may be grown. While the indium (In) is not injected thereto, the first sub-semiconductor layer 17a made of GaN may be grown using the TMG gas, and the nitrogen gas. Subsequently, while the indium (In) is injected thereto, the second sub-semiconductor layer 17b made of InGaN may be grown using a mixture of the indium (In) with the TMG gas, and the nitrogen gas.

For example, a thickness T1 of the first sub-semiconductor layer 17a may be in a range of about 15 nm to about 40 nm. For example, a thickness T2 of the second sub-semiconductor layer 17b may be in a range of about 2 nm to about 5 nm.

A ratio between the thickness of the second sub-semiconductor layer 17b and the thickness of the first sub-semiconductor layer 17a may be in a range of about 1:3 to about 1:8. In this thickness range, a growth rate in vertical and horizontal directions of the third semiconductor layer 17 may be controlled, so that the recess 18 such as the V-pit may be easily formed.

For example, an angle between the bottom face of the third semiconductor layer 17, and an inclined lateral face of the recess 18 may be defined as an inclination angle $\theta_1$. The inclination angle $\theta_1$ may be 85° or smaller. When the inclination angle $\theta_1$ is smaller than or equal to 85°, an amount of light emitted from the semiconductor device may be increased.

When the ratio between the thickness of the second sub-semiconductor layer 17b and the thickness of the first sub-semiconductor layer 17a is smaller than 1:3 or is greater than 1:8, an arrangement density of the recesses 18 or the inclination angle of the inclined face of the recess 18 may change, resulting in deterioration of the light output, the operation voltage, and ESD (Electro Static Discharge) characteristics of the semiconductor device 10. The arrangement density thereof may refer to a distribution probability of the recesses 18.

In FIG. 2, the recess 18 is shown to start to extend from the second sub-semiconductor layer 17b of the first pair. However, the present disclosure is not limited thereto. A starting position of the extension of the recess 18 or a bottom position of thereof may vary.

The recess 18 of the third semiconductor layer 17 may improve the electrical and optical characteristics of the semiconductor device 10. However, when the recesses 18 are highly densely arranged, that is, when the arrangement density of the recess 18 is excessive, the electrical and optical characteristics, and reliability of the semiconductor device 10 may be deteriorated. Therefore, controlling the arrangement density of the recesses 18, and the size of the recess 18 may allow improving the optical and electrical characteristics of the semiconductor device 10, and securing the reliability thereof.

As shown in FIG. 2, a width W1 or a size of the recess 18 may increase as the recess extends from a bottom to a top of the third semiconductor layer 17. In this case, in the topmost region of the second sub-semiconductor layer 17b of the third pair, a maximum width W1 of the recess 18 may be obtained.

The first semiconductor layer 15 may be grown, for example, at a temperature of about 1000° C. to 1,100° C. In this case, the third semiconductor layer 17 may be grown at a temperature (that is, about 830° C. to about 870° C.) lower than the growth temperature of the first semiconductor layer 15. Further, the first and second sub-semiconductor layers 17a and 17b included in each pair of the third semiconductor layer 17 may be grown to have different thicknesses from each other. In addition, the indium (In) may be selectively contained in the first and second sub-semiconductor layers 17a and 17b of each pair of the third semiconductor layer 17. Therefore, as the first sub-semiconductor layer 17a and the second sub-semiconductor layer 17b of the third semiconductor layer 17 are periodically grown while performing the temperature adjustment, the thickness adjustment, and the adjustment of the indium (In) content, the formation of the recess 18 such that the V-pit may be facilitated and may be precisely controlled.

Detailed Structure of Fifth Semiconductor Layer

Figure 3:
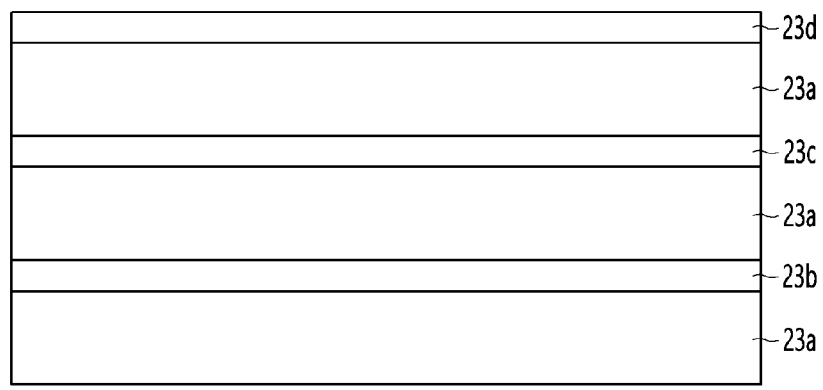
FIG. 3 shows a sixth semiconductor layer in detail.

FIG. 3 shows the sixth semiconductor layer in detail.

Referring to FIG. 3, the sixth semiconductor layer 23 may be composed of a first pair, a second pair, and a third pair. However, the present disclosure is not limited thereto.

Each of the first pair, the second pair, and the third pair may include a first sub-semiconductor layer 23a and each of second sub-semiconductor layers 23b, 23c and 23d. Accordingly, a top face of the second sub-semiconductor layer 23b of the first pair may be in contact with a bottom face of the first sub-semiconductor layer 23a of the second pair. a top face of the second sub-semiconductor layer 23c of the second pair may contact the bottom face of the first sub-semiconductor layer 23a of the third pair.

For example, a bottom face of the first sub-semiconductor layer 23a of the first pair may be in contact with a top face of the active layer 21. A top face of the second sub-semiconductor layer 23d of the third pair may contact a bottom face of the second semiconductor layer 25. However, the present disclosure is not limited thereto.

For example, the first sub-semiconductor layer 23a may be made of GaN. Each of the second sub-semiconductor layers 23b, 23c, and 23d may be made of AlGaN.

Aluminum (Al) contents in the second sub-semiconductor layers 23b, 23c, and 23d of the first pair, the second pair, and the third pair respectively may be different from each other.

For example, the second sub-semiconductor layer 23b of the first pair may include an $Al_xGa_{1-x}N/GaN$ stack, the second sub-semiconductor layer 23c of the second pair may include $Al_yGa_{1-y}N$, and the second sub-semiconductor layer 23d of the third pair may include $Al_zGa_{1-z}N$. In this case, a relationship between x, y, and z may satisfy following Equation 1 and Equation 2.

$$y=x-0.03, \qquad \text{(Equation 1)}$$

$$z=y-0.03 \qquad \text{(Equation 2)}$$

x may be in a range of 0.21 to 0.24.

For example, when x is 0.24, the aluminum (Al) content of the second sub-semiconductor layer 23b of the first pair may be 24%, the aluminum (Al) content of the second sub-semiconductor layer 23c of the second pair may be 21%, and the aluminum (Al) content of the second sub-semiconductor layer 23d of the third pair may be 18%.

For example, when x is 0.21, the aluminum (Al) content of the second sub-semiconductor layer 23b of the first pair may be 21%, the aluminum (Al) content of the second sub-semiconductor layer 23c of the second pair may be 18%, the aluminum (Al) content of the second sub-semiconductor layer 23d of the third pair may be 15%.

Accordingly, each of the aluminum (Al) contents of the second sub-semiconductor layers 23b, 23c, and 23d of the first pair, the second pair, and the third pair respectively of the sixth semiconductor layer 23 may be adjusted to a value in a range of about 15% to about 24%. In this content range, the blocking performance of the first carrier may be improved, and the injection efficiency in which the second carrier of the second semiconductor layer 25 is injected into the active layer 21 may be improved.

Figure 4:
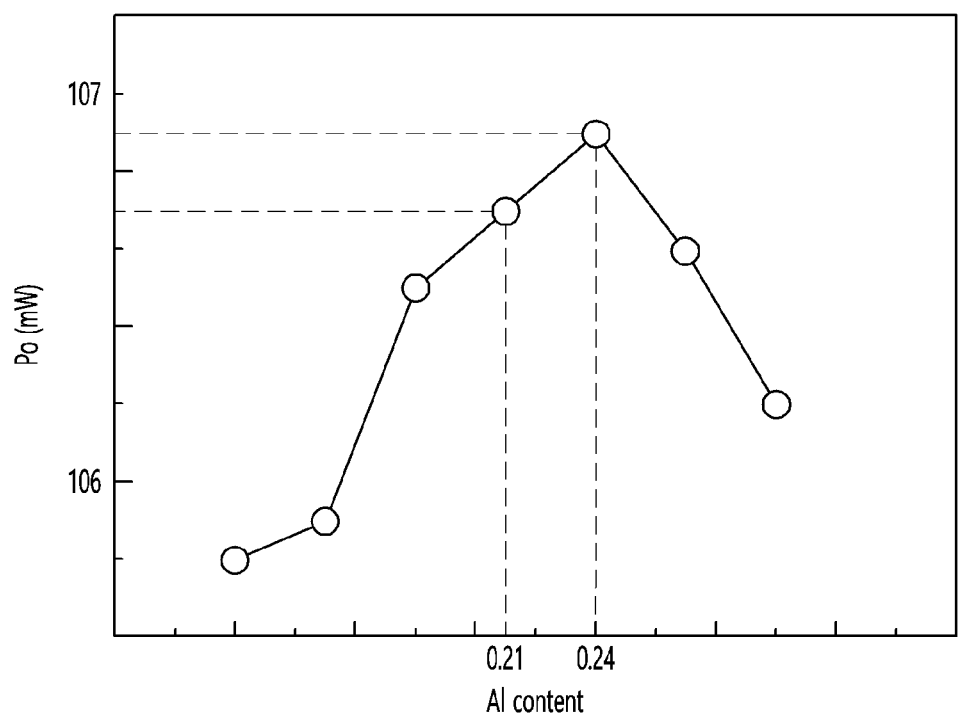
FIG. 4 shows luminous intensity based on an aluminum Al content of the sixth semiconductor layer.

The luminous intensity Po of the semiconductor device 10 varies depending on the aluminum (Al) content, as shown in FIG. 4.

FIG. 4 shows the luminous intensity based on the aluminum (Al) content of the sixth semiconductor layer.

Referring to FIG. 4, it may be identified that when the aluminum (Al) content is 24%, the luminous intensity Po is the highest. It may be identified that when the aluminum (Al) content is smaller or greater than 24%, the luminous intensity Po is lowered.

The aluminum (Al) content of the second sub-semiconductor layer 23b of the first pair may be in a range of about 21% to 24%. The aluminum (Al) content of the second sub-semiconductor layer 23c of the second pair may be in a range of about 18% to about 21%. The aluminum (Al) content of the second sub-semiconductor layer 23d of the third pair may be in a range of about 15% to about 18%. As described above, the aluminum (Al) contents of the second sub-semiconductor layers 23c, and 23d of the second pair, and the third pair respectively may be determined based on the above Equation 1 and Equation 2.

When the aluminum (Al) content is smaller than 21%, the first carrier overflows from the active layer 21 to the second semiconductor layer 25, such that light loss may occur due to leakage current. When the aluminum (Al) content exceeds 24%, the second carrier is not easily injected from the second semiconductor layer 25 into the active layer 21, such that the operation voltage may increase.

Horizontal Semiconductor Device

Figure 5:
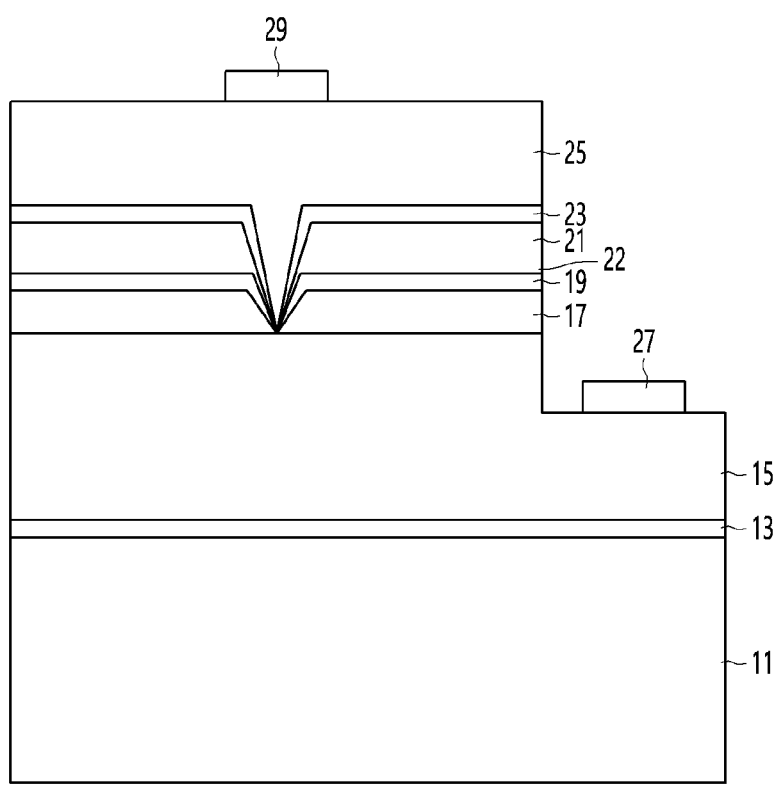
FIG. 5 shows a horizontal semiconductor device.

FIG. 5 shows a horizontal semiconductor device.

The horizontal semiconductor device may be manufactured by adding a subsequent process to a manufacturing process of the semiconductor device according to the first embodiment shown in FIG. 1.

Referring to FIG. 5, when the semiconductor device according to the first embodiment shown in FIG. 1 is provided, mesa etching may be executed such that a partial region of the semiconductor structure may be removed. That is, an edge region of each of the second semiconductor layer 25, the sixth semiconductor layer 23, the active layer 21, the fourth semiconductor layer 19, the third semiconductor layer 17, and the first semiconductor layer 15 may be removed via the mesa etching. An upper portion of the first semiconductor layer 15 may partially be removed, and a lower portion thereof may not be removed.

Subsequently, a first electrode 27 may be disposed on the first semiconductor layer 15 which has been partially etched via the mesa etching. A second electrode 29 may be disposed on the second semiconductor layer 25. Each of the first electrode 27 and the second electrode 29 may be made of a metal material having excellent conductivity. Each of the first electrode 27 and the second electrode 29 may include at least one layer.

A top face of the first electrode 27 may have a lower vertical level than that of the active layer 21 of the semiconductor structure. Thus, when light generated in the active layer 21 of the semiconductor structure is emitted from the lateral face of the active layer 21, the light may not be reflected from the first electrode 27.

Otherwise, the top face of the first electrode 27 may have a higher vertical level than that of the active layer 21 of the semiconductor structure. In this case, when light generated in the active layer 21 of the semiconductor structure is emitted from the lateral face of the active layer 21, the light may be reflected from a lateral face of the first electrode 27.

Although not shown, a transparent electrode layer may be formed on the second semiconductor layer 25. The transparent electrode layer may be formed using a sputtering apparatus. However, the present disclosure is not limited thereto.

When the transparent electrode layer is formed on the second semiconductor layer 25, the second electrode 29 may be disposed on the transparent electrode layer.

The transparent electrode layer may be made of a transparent conductive material. The transparent electrode layer may be made of a material having excellent ohmic characteristics with the second semiconductor layer 25, and having excellent current spreading characteristics. For example, the transparent electrode layer may be made of at least one selected from a group consisting of ITO, IZO (In—ZnO), GZO (Ga—ZnO), AZO (Al—ZnO), AGZO (Al—Ga ZnO), IGZO (In—Ga ZnO), $IrO_x$, $RuO_x$, $RuO_x$/ITO, $Ni/IrO_x$/Au, and $Ni/IrO_x$/Au/ITO. However, the present disclosure is not limited thereto.

After the transparent electrode layer is disposed on the second semiconductor layer 25, mesa etching may be performed. Alternatively, after the mesa etching is performed, the transparent electrode layer may be disposed on the second semiconductor layer 25.

The transparent electrode layer may be disposed on the second semiconductor layer 25, and, then, the second electrode 29 may be disposed on the transparent electrode layer. Alternatively, the transparent electrode layer may be disposed on the second semiconductor layer 25, and then mesa etching may be performed, and then second electrode 29 may be disposed on the transparent electrode layer.

Although not shown, the horizontal semiconductor device shown in FIG. 5 may be turned upside down, and may be adopted into a semiconductor device package. In this case, the horizontal semiconductor device may be used as a flip-type semiconductor device. In this case, a reflective electrode layer may be additionally disposed on the second semiconductor layer 25. However, the present disclosure is not limited thereto.

In summary, the first embodiment is as follows.

The first conductive-type semiconductor layer may contain a first dopant including the silicon (Si), and a second dopant including the carbon (C). The first conductive-type semiconductor layer may include the first and third layers 15 and 17 having different first dopant concentrations. When the concentration of the first dopant in the first semiconductor layer 15 is defined as a, the concentration of the second dopant in the first semiconductor layer 15 is defined as b, the concentration of the first dopant in the third semiconductor layer 17 is defined as c, and the concentration of the second dopant in the third semiconductor layer 17 is defined as d, the concentrations a, b, c, and d may satisfy a following relationship 3.

$$a > c, \text{ and } b \leq d \quad \text{(Relationship 3)}$$

A ratio between the concentration of the first dopant in the first semiconductor layer 15, and the concentration of the first dopant in the third semiconductor layer 17 may satisfy a following Equation 4.

$$a:c = 1:o \text{ to } 1:p \quad \text{(Equation 4)}$$

where o denotes a lower limit of the concentration of the first dopant in the third semiconductor layer 17, and p denotes an upper limit of the concentration of the first dopant in the third semiconductor layer 17. In one example, o may be 0.027, and p may be 0.4.

A ratio between the concentration of the second dopant in the first semiconductor layer 15, and the concentration of the second dopant in the third semiconductor layer 17 may satisfy a following Equation 5.

$$b:d = 1:q \text{ to } 1:r \quad \text{(Equation 5)}$$

where q denotes a lower limit of the concentration of the second dopant of the third semiconductor layer 17, and r denotes an upper limit of the concentration of the second dopant in the third semiconductor layer 17. In one example, q may be 1, and r may be 1.5.

The recess having a V-pit shape may include first and second recesses 18 and 20.

In this connection, a first inclination angle $\theta_1$ of a first inclined face of the second recess 20 may be greater than a second inclination angle $\theta_2$ of a second inclined face of the first recess 18.

A second maximum width W2 of the second recess 20 may be greater than a first maximum width W1 of the first recess 18.

SECOND EMBODIMENT

Figure 6:
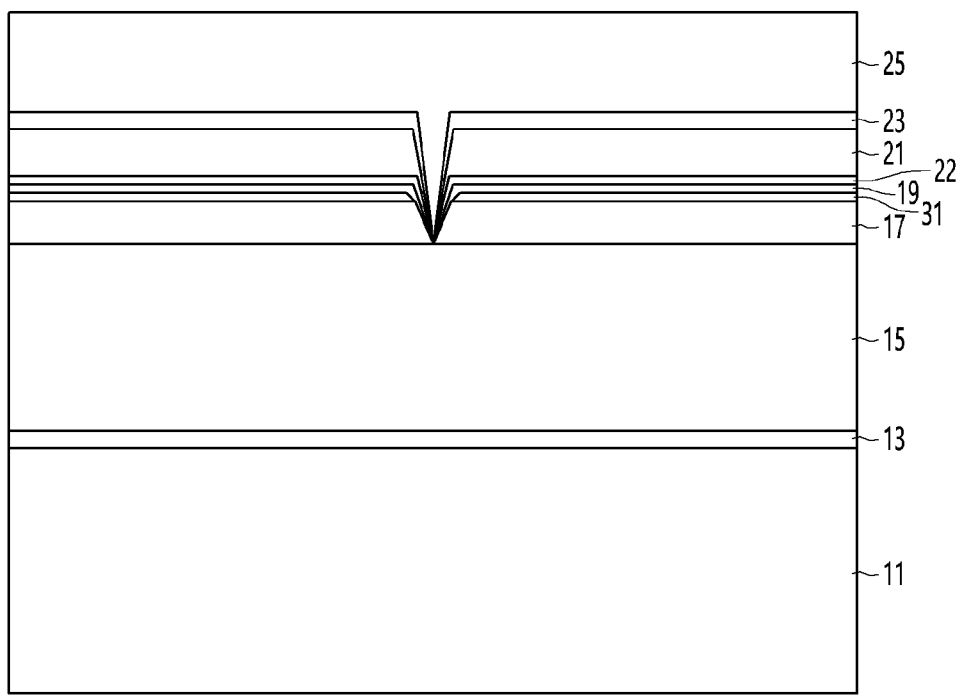
FIG. 6 shows a semiconductor device according to a second embodiment.

FIG. 6 shows a semiconductor device according to the second embodiment.

The second embodiment is the same as the first embodiment except for a seventh semiconductor layer 31. In the second embodiment, the same reference numerals are assigned to the same features, components, operations, structures, and functions as the first embodiment, and detailed descriptions thereof are omitted. Description missing in the second embodiment may be easily understood from the first embodiment as described above.

Referring to FIG. 6, a semiconductor structure may be composed of the first semiconductor layer 15, the active layer 21, and the second semiconductor layer 25.

The buffer layer 13 may be disposed under the first semiconductor layer 15. The third semiconductor layer 17, and the fourth semiconductor layer 19 may be disposed between the first semiconductor layer 15 and the active layer 21. The sixth semiconductor layer 23 may be disposed between the active layer 21 and the second semiconductor layer 25.

The buffer layer 13, the first semiconductor layer 15, the third semiconductor layer 17, the fourth semiconductor layer 19, the active layer 21, the sixth semiconductor layer 23, and the second semiconductor layer 25 may be disposed over the substrate 11.

Figure 7:
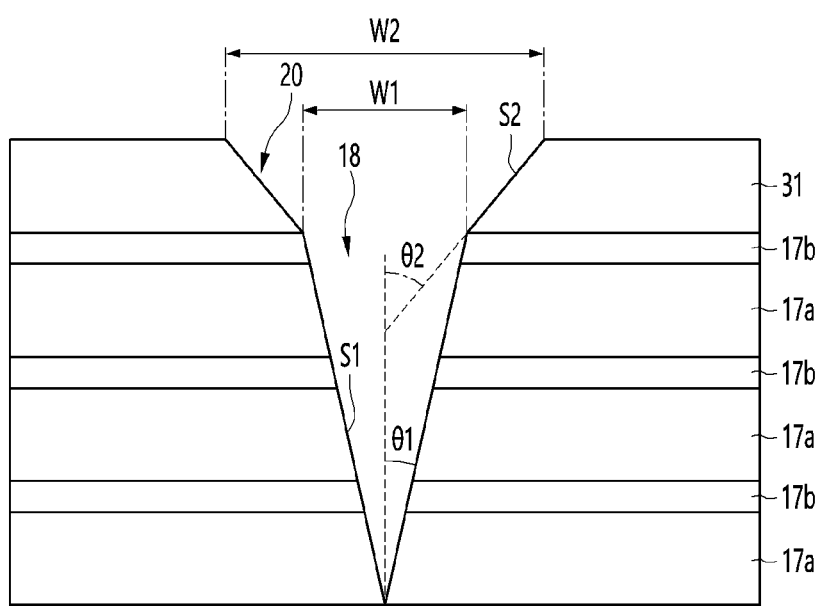
FIG. 7 shows a third semiconductor layer and a sixth semiconductor layer in detail.

As shown in FIG. 7, the seventh semiconductor layer 31 may be disposed on the third semiconductor layer 17.

For example, the seventh semiconductor layer 31 may be disposed between the third semiconductor layer 17 and the fourth semiconductor layer 19.

When the fourth semiconductor layer 19 is omitted, the seventh semiconductor layer 31 may be disposed between the third semiconductor layer 17 and the active layer 21.

In FIG. 7, the seventh semiconductor layer 31 is shown to be separate from the third semiconductor layer 17. Alternatively, the seventh semiconductor layer 31 may be at least one sub-semiconductor layer among a plurality of sub-semiconductor layers of the third semiconductor layer 17.

The third semiconductor layer 17 includes the first pair, the second pair, and the third pair. Each pair may include the first sub-semiconductor layer 17a and the second sub-semiconductor layer 17b. The first sub-semiconductor layer 17a in each pair of the third semiconductor layer 17 may include a GaN layer not containing the indium (In). The second sub-semiconductor layer 17b in each pair may include an InGaN layer containing the indium (In).

The seventh semiconductor layer 31 may be disposed, for example, on the third pair as a top portion of the third semiconductor layer 17. That is, the seventh semiconductor layer 31 may be disposed on the second sub-semiconductor layer 17b of the third pair of the third semiconductor layer 17. The seventh semiconductor layer 31 may including a GaN layer not containing the indium (In). However, the present disclosure is not limited thereto.

A growth temperature of the third semiconductor layer 17 may be lower than a growth temperature of the first semiconductor layer 15 or the active layer 21. A growth temperature of the seventh semiconductor layer 31 may be lower than a growth temperature of the third semiconductor layer 17.

The growth temperature of the third semiconductor layer 17 may be, for example, in a range of about 830° C. to about 870° C. Specifically, the growth temperature of the third semiconductor layer 17 may be 850° C.

The growth temperature of the seventh semiconductor layer 31 may be in a range of about 790° C. to about 820° C. Specifically, the growth temperature of the third semiconductor layer 17 may be 805° C.

Each of the third semiconductor layer 17 and the seventh semiconductor layer 31 may contain carbon (C).

A carbon concentration therein may be inversely proportional to the growth temperature. That is, the carbon concentration may increase as the growth temperature decreases.

Since the growth temperature of the seventh semiconductor layer 31 is lower than the growth temperature of the third semiconductor layer 17, the carbon concentration of the seventh semiconductor layer 31 may be greater than the carbon concentration of the third semiconductor layer 17.

A ratio between the carbon concentration of the seventh semiconductor layer 31, and the carbon concentration of the third semiconductor layer 17 may be in a range of about 1:1 to about 1.6:1.

For example, the carbon concentration of the third semiconductor layer 17 may be in a range of about $4 \times 10^{16}$ cm$^{-3}$ to $6 \times 10^{16}$ cm$^{-3}$. The carbon concentration of the seventh semiconductor layer 31 may be in a range of about $6 \times 10^{16}$ cm$^{-3}$ to about $1 \times 10^{17}$ cm$^{-3}$.

When current is injected from the first semiconductor layer 15 to the third semiconductor layer 17, the uniformity of the current injected into the semiconductor device may be improved due to a difference between electrical resistances of the first semiconductor layer 15 and the third semiconductor layer 17.

Each of the third semiconductor layer 17 and the seventh semiconductor layer 31 may contain n-type dopants such as Si, Ge, Sn, Se, and Te. A doping concentration, for example, a Si concentration in the third semiconductor layer 17 may be in a range of about $8 \times 10^{17}$ cm$^{-3}$ to about $2 \times 10^{18}$ cm$^{-3}$, and a doping concentration, for example, a Si concentration in the seventh semiconductor layer 31 may be in a range of about $2 \times 10^{18}$ cm$^{-3}$ to about $5 \times 10^{18}$ cm$^{-3}$. In this concentration range, the operation voltage, and the epitaxy quality may be improved.

The doping concentration in the seventh semiconductor layer 31 may be larger than the doping concentration in the third semiconductor layer 17.

A ratio between the silicon (Si) concentration of the seventh semiconductor layer 31, and the Si concentration of the third semiconductor layer 17 may be in a range of about 1:1 to about 1.625:1.

A ratio between the carbon (C) concentration and the silicon (Si) concentration in the seventh semiconductor layer 31 may be in a range of about 1:20 to about 1:80. Increase in electrical resistance of the seventh semiconductor layer 31 may be suppressed in this ratio range.

That is, when the carbon doping concentration of the seventh semiconductor layer 31 is higher than the carbon doping concentration of the third semiconductor layer 17, the electrical resistance of the seventh semiconductor layer 31 may be cancelled. Specifically, the silicon doping concentration of the seventh semiconductor layer 31 may be higher than the silicon doping concentration of the third semiconductor layer 17. Thus, the increase in electrical resistance due to the increase in the carbon doping concentration of the seventh semiconductor layer 31 such that the carbon concentration of the seventh semiconductor layer 31 is higher than that of the third semiconductor layer 17 may be cancelled due to the higher Si doping concentration of the seventh semiconductor layer 31. In this way, the electrical resistance of the seventh semiconductor layer 31 may be equal to or smaller than the electrical resistance of the third semiconductor layer 17.

In this manner, the electrical resistance of the seventh semiconductor layer 31 may increase, such that the first carrier of the first semiconductor layer 15 may be easily injected into the active layer 21.

In one example, a thickness of the third semiconductor layer 17 may be in a range of about 130 nm to about 170 nm. A thickness of the seventh semiconductor layer 31 may be in a range of about 30 nm to about 70 nm. The thickness of the third semiconductor layer 17 may be 150 nm, and the thickness of the seventh semiconductor layer 31 may be 50 nm.

A ratio between the thickness of the seventh semiconductor layer 31 and the thickness of the third semiconductor layer 17 may be in a range of about 1:2.5 to about 1:7.14. In this thickness ratio range, the operation voltage may be improved, and the recesses 18 may be arranged uniformly.

In one example, adjusting the ratio between the thicknesses of the third semiconductor layer 17 and the seventh semiconductor layer 31 while the growth temperature of the seventh semiconductor layer 31 is lower than the growth temperature of the third semiconductor layer 17 may allow the width $W_2$ of the second recess 20 of the seventh semiconductor layer 31 to be larger than the width $W_1$ of the first recess 18 of the third semiconductor layer 17. The second recess 20 may upwardly extend from the first recess 18.

That is, the first recess 18 having the first maximum width $W_1$ may be formed in the topmost region of the second sub-semiconductor layer 17b of the third pair of the third semiconductor layer 17. The second recess 20 having the second maximum width $W_2$ may be formed in the topmost region of the seventh semiconductor layer 31. The second maximum width $W_2$ may be greater than the first maximum width $W_1$.

In addition, a second angular spacing between a second inclined face S2 of the second recess 20 in the seventh semiconductor layer 31 and a normal line may be greater than a first angular spacing between a first inclined face S1 of the first recess 18 in the third semiconductor layer 17 and the normal line.

For example, a first inclination angle between the first inclined face of the first recess 18 in the third semiconductor layer 17 and the normal line may be defined as $\theta_1$, and a second inclination angle between the second inclined face of the second recess 20 in the seventh semiconductor layer 31 and the normal line may be defined as $\theta_2$. In this case, the second inclination angle $\theta_2$ may be greater than the first inclination angle $\theta_1$.

In this way, as the width $W_2$ in the seventh semiconductor layer 31 is increased, and the second angular spacing between the second inclined face S2 of the second recess 20 in the seventh semiconductor layer 31 and the normal line is increased, the second recess 20 of the sixth semiconductor may horizontally extend beyond than the first recess 18 of the third semiconductor layer 17. As the second recess 20 horizontally extends beyond than the first recess 18 of the third semiconductor layer 17, the light generated in the active layer 21 may be more efficiently extracted through the second recess 20, so that the luminous intensity may be increased.

In summary, the second embodiment is as follows.

The first conductive-type semiconductor layer may include a first dopant including the silicon, and a second dopant including the carbon. The first conductive-type semiconductor layer may include the first and third layers 15 and 17 having different first dopant concentrations. When the concentration of the first dopant in the first semiconductor layer 15 is defined as a, the concentration of the second dopant in the first semiconductor layer 15 is defined as b, the concentration of the first dopant in the third semiconductor layer 17 is defined as c, and the concentration of the second dopant in the third semiconductor layer 17 is defined as d, the concentrations a, b, c, and d may satisfy the above Relationship 3.

A ratio between the concentration of the first dopant in the first semiconductor layer 15, and the concentration of the first dopant in the third semiconductor layer 17 may satisfy the above Equation 4.

A ratio between the concentration of the second dopant in the first semiconductor layer 15 and the concentration of the second dopant in the third semiconductor layer 17 may satisfy the above Equation 5.

The first conductive-type semiconductor layer may include the seventh semiconductor layer 31 having a different first dopant concentration from that of the third semiconductor layer 17.

When the concentration of the first dopant of the seventh semiconductor layer 31 is defined as e, and the concentration of the second dopant of the seventh semiconductor layer 31 is defined as f, a following Relationship 6 may be satisfied.

$$c<e<a, \text{ and } b<d<f \quad \text{(Relationship 6)}$$

A ratio between the concentration of the first dopant in the third semiconductor layer 17, and the concentration of the first dopant in the seventh semiconductor layer 31 may satisfy a following Equation 7.

$$c{:}e = 1{:}s \text{ to } 1{:}t \quad \text{(Equation 7)}$$

where s denotes a lower limit of the concentration of the first dopant in the seventh semiconductor layer 31, and t denotes an upper limit of the concentration of the first dopant in the seventh semiconductor layer 31. In one example, s may be 1, and t may be 6.25.

A ratio between the concentration of the second dopant in the third semiconductor layer 17 and the concentration of the second dopant in the seventh semiconductor layer 31 may satisfy a following Equation 8.

$$d{:}f = 1{:}u \text{ to } 1{:}v \quad \text{(Equation 8)}$$

where u denotes a lower limit of the concentration of the second dopant of the seventh semiconductor layer 31, and v denotes an upper limit of the concentration of the first dopant in the seventh semiconductor layer 31. In one example, u may be 1, and v may be 2.5.

A ratio between the thickness of the seventh semiconductor layer 31, and the thickness of the third semiconductor layer 17 may be 1:2.5 to 1:7.14. When the ratio between the thickness of the seventh semiconductor layer 31, and the thickness of the third semiconductor layer 17 is 1:2.5 or greater, the width of the second recess 20 is increased, such that the light generated in the active layer 21 may be extracted more efficiently through the second recess 20, so that the luminous intensity may be increased. When the ratio between the thickness of the seventh semiconductor layer 31, and the thickness of the third semiconductor layer 17 is 1:7.14 or smaller, the thickness of the seventh semiconductor layer 31 may be decreased, thereby to minimize the thickness of the semiconductor device 10 or 10A.

The third semiconductor layer 17 may have a plurality of first recesses 18. The seventh semiconductor layer 31 may have a plurality of second recesses 20 overlapping the plurality of first recesses 18, respectively in a first direction. The first direction may refer to a direction from the second conductive-type semiconductor layer toward the first conductive-type semiconductor layer.

A combination of the first and second recesses 18 and 20 may have a V-pit shape.

The first inclination angle $\theta_1$ of the first inclined face of the second recess 20 may be greater than the second inclination angle $\theta_2$ of the second inclined face of the first recess 18.

The second maximum width $W_2$ of the second recess 20 may be greater than the first maximum width $W_1$ of the first recess 18.

The third semiconductor layer 17 may be disposed on the first semiconductor layer 15. The seventh semiconductor layer 31 may be disposed between the third semiconductor layer 17 and the active layer 21.

THIRD EMBODIMENT

Figure 8:
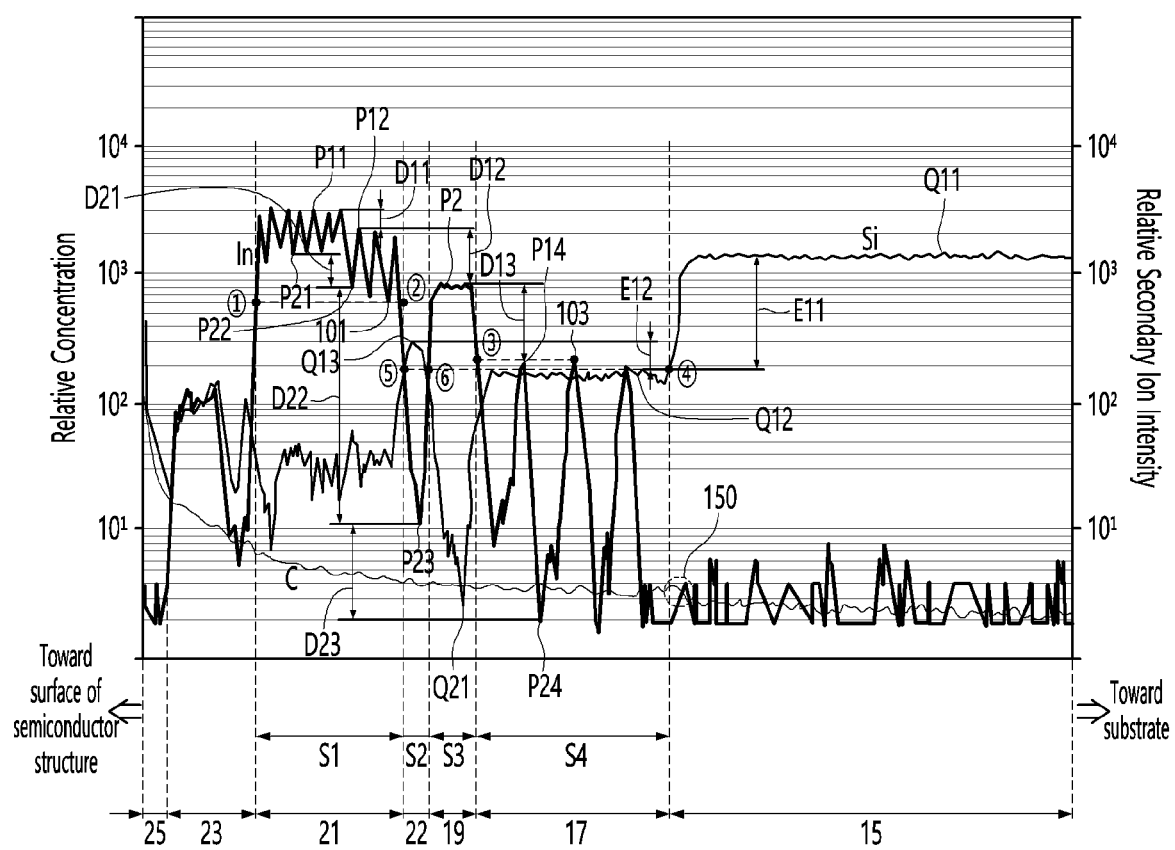
FIG. 8 shows SIMS data for detecting a component of each layer of a semiconductor device according to a third embodiment.

FIG. 8 shows SIMS (Secondary Ion Mass Spectroscopy) data for detecting a component of each layer of a semiconductor device according to a third embodiment. The SIMS refers to a method for irradiating primary ions to the semiconductor structure and detecting secondary ions constituting the semiconductor structure as scattered by the primary ions and emitted. The SIMS may include TOF-SIMS (Time-of-Flight Secondary Ion Mass Spectrometry) and dynamic-SIMS.

The third embodiment relates to a component content and a doping concentration of each layer of a semiconductor device.

The SIMS data may be used to detect a secondary ion intensity and/or a doping concentration of each layer of the semiconductor device. That is, when the primary ions are irradiated to the first conductive-type semiconductor layer, the active layer 21, and the second conductive-type semiconductor layer as shown in FIG. 1, the secondary ions are released therefrom. Thus, the indium (In) ion intensity, the Si concentration, and the C concentration of the first conductive-type semiconductor layer, the active layer 21, and the second conductive-type semiconductor layer may be measured based on the released secondary ions.

The first semiconductor layer may include at least one semiconductor layer among the first semiconductor layer 15, the third semiconductor layer 17, the fourth semiconductor layer 19, and the fifth semiconductor layer 22. The second semiconductor layer may include at least one semiconductor layer among the sixth semiconductor layer 23 and the second semiconductor layer 25.

SIMS may employ TOF-SIMS (Time-of-Flight Secondary Ion Mass Spectrometry). Thus, the SIMS data may refer to analysis data from the TOF-SIMS.

SIMS data may be obtained by irradiating the primary ions to a target surface, and counting the number of the secondary ions as emitted. In this connection, the primary ions may be selected from $O_2^+$, $Cs^+$, $Bi^+$, etc. Acceleration voltage may be adjusted to a value within 20 keV to 30 keV. Irradiation current may be adjusted to a value in a range of from 0.1 pA to 5.0 pA. An irradiation area may be 20 nm×20 nm. However, conditions for measuring a sample are not limited thereto, and may vary depending on a component of the sample.

The SIMS data may include collection of secondary ion mass spectra while gradually etching the semiconductor structure inwardly from a surface of the semiconductor structure (depth being zero).

Further, a result from the SIMS analysis may be interpreted as a spectrum related to the secondary ion intensity or the doping concentration of a material. In this connection, noise in a range of 0.95 times to 1.05 times may occur in the analysis of the secondary ion intensity or the doping concentration. Therefore, the term "same as or equal to" may refer to inclusive noise of 0.9 to 1.1 times of one specific secondary ion intensity or doping concentration.

Based on the SIMS data shown in FIG. 8, a layer corresponding to each of points ① to ⑦, and each of sections S1 to S4 may be easily identified based on a relative intensity of secondary ions and/or a concentration of a dopant. In the secondary ion analysis, the secondary ion intensity may be expressed as a log scale. However, the present disclosure is not limited thereto. The secondary ion intensity may be expressed as a linear scale. The secondary ion intensity may mean an intensity of secondary ions that are emitted from the semiconductor structure after the primary ions are irradiated to the semiconductor structure. The secondary ions may include at least one of In, Al, Ga, N, As, and P. In this embodiment, the relative intensity of the indium (In) ions is described. However, the present disclosure is not limited thereto. A relative intensity of ions of other materials may be referenced.

In the third embodiment, each of layers may be easily identified using the indium (In) ion intensity, and a concentration of the first dopant as shown in a graph. For example, first to sixth points ① to ⑥ may be defined using the indium (In) ion intensity, and the concentration of the first dopant. The layers may be identified based on the first to sixth points ① to ⑥ as defined as described above. In a following description, the first dopant may include the silicon (Si) and the second dopant may include carbon (C).

In FIG. 8, a plurality of inflection points at which the indium (In) ion intensity is 0.3 to 0.5 times larger than the highest indium (In) ion intensity may be present within the semiconductor structure. Specifically, each of the plurality of inflection points may refer to an inflection point between a region where the indium (In) ion intensity decreases in a direction toward the substrate, and a region where the indium (In) ion intensity increases in a direction toward a surface of the semiconductor structure. As used herein, the direction toward the surface may be referred to as a first direction, and the direction toward the substrate may be referred to as a second direction. However, the present disclosure is not limited thereto. The inflection point may refer to a point at which the indium (In) ion intensity may be minimum or maximum in the direction to the surface or in the direction toward the substrate of the semiconductor structure. Within the semiconductor structure, a point at which the indium (In) ion intensity may be maximum may be present. In a region in which the indium (In) ion intensity is 0.3 to 0.5 times of the maximum indium (In) ion intensity, a point at which the indium (In) ion intensity is minimum may be present. The indium (In) ion intensity may be minimum at a point 101. The first point ① may be adjacent to the surface and may have the same indium (In) ion intensity as that at the point 101. The second point ② may be closest to the substrate and may have the same indium (In) ion intensity as that at the point 101. A region between the first point ① and the second point ② may correspond to the active layer. Further, the active layer may correspond to the active layer of the first embodiment as described above. However, the present disclosure is not necessarily limited thereto. A region in which a plurality of peaks P11 and P12, and valleys P21 and P22 are present and in which the indium (In) ion intensity is the highest may correspond to the well layer. When a barrier layer corresponding to the indium (In) ion intensity which is 0.3 to 0.5 times of the indium (In) ion intensity at the peak point P11 is present in the semiconductor structure, light-emitting efficiency of the semiconductor device may be improved.

In FIG. 8, at least one peak P14 having the indium (In) ion intensity which is 0.5 to 0.7 times of the highest indium (In) ion intensity may be present in a region spaced from the second point ② in the direction toward the substrate. In the region which the at least one peak P14 is present, a point 103 has the highest indium (In) ion intensity. In this connection, the third point ③ may have the same indium (In) ion intensity as that at the point 103 and may be closest to the surface.

Further, in FIG. 8, the fourth point ④, the sixth point ⑥, and the fifth point ⑤ may be present in a region with the concentration of the first dopant is 0.1 times to 0.2 times of the highest concentration of the first dopant. In this region, the fourth point ④ may have a maximum first dopant concentration and may be adjacent to the substrate. In this region, the sixth point ⑥ and the fifth point ⑤ may be adjacent to the surface and a maximum first dopant concentration. The fifth point ⑤ may be closer to the surface than the sixth point ⑥ may be.

As described above, the plurality of peaks P11 and P12, and the valleys P21 and P22 may be arranged in the region between the first point ① and the second point ②. A point at which the indium (In) ion intensity is the highest may be located in the region between the first point ① and the second point ②. The point at which the indium (In) ion intensity is the highest may correspond to one of a plurality of first peaks P11. The second peak P11 may have the indium (In) ion intensity which is 0.93 to 0.95 times of the highest indium (In) ion intensity. The first valley P21 may have the indium (In) ion intensity which may be 0.9 to 0.93 times of the highest indium (In) ion intensity. The second valley P22 may have the indium (In) ion intensity which may be 0.3 to 0.5 times of the highest indium (In) ion intensity.

A plurality of fourth peaks P14, and fourth valleys P24 may be arranged in a region between the third point ③ and the fourth point ④. The fourth peak P14 may have the indium (In) ion intensity which may be 0.5 to 0.7 times of the highest indium (In) ion intensity at the point 103. The fourth valley P24 may have the lowest highest indium (In) ion intensity in a region between the fourth peaks P14.

A third level Q13 may be placed in a region between the fifth point ⑤ and the sixth point ⑥. The third level Q13 may correspond to a peak. Alternatively, a plurality of points may have the same level as or a similar level to the third level Q13. The third level Q13 may have the concentration of the first dopant which may be 0.2 to 0.35 times of the highest concentration of the first dopant.

In a region between the third point ③ and the sixth point ⑥, at least one third peak P2 in terms of the indium (In) ion intensity may be located. The third peak P2 may have the indium (In) ion intensity which may be 0.7 to 0.85 times of the highest indium (In) ion intensity.

The first to fourth sections S1, S2, S3, and S4 may be defined between adjacent points of the first to sixth points ① to ⑥. That is, a region between the first point ① and the second point ② may be defined as the first section S1. A region between the fifth point ⑤ and the sixth point ⑥ may be defined as the second section S2. In addition, a region between the sixth point ⑥ and the third point ③ may be defined as the third section S3. A region between the third point ③ and the fourth point ④ may be defined as the fourth section S4.

In the first section S1, the plurality of first peaks P11, and the plurality of second peaks P12 lower than the first peaks P11 in terms of the indium (In) ion intensity may be positioned. In the first section S1, the plurality of first valleys P21, and the plurality of second valleys P22 lower than the first valleys P21 in terms of the indium (In) ion intensity may be positioned. In the first section S1, the plurality of first valleys P21 may be alternately arranged with the plurality of first peaks P11. In the first section S1, the plurality of second valleys P22 may be alternately arranged with the plurality of second peaks P12.

Thus, in the first section S1, the plurality of first peaks P11, and the plurality of first valleys P21 in terms of the indium (In) ion intensity are alternately arranged with each other, and the plurality of second peaks P12 and the plurality of second valleys P22 in terms of the indium (In) ion intensity are alternately arranged with each other. In this connection, the active layer 21 may be identified based on the first section S1. That is, the active layer 21 may correspond to the first section S1. However, the present disclosure is not limited thereto.

As described above, in the active layer 21, a plurality of well layers and a plurality of barrier layers may be alternately arranged with each other. Therefore, the first peak P11 may indicate the indium (In) ion intensity as detected in the well layer, and the first valley P21 may indicate the indium (In) ion intensity as detected in the barrier layer. A ratio between the indium ion intensity of the first valley P21 and the indium ion intensity of the first peak P11 may be in a range of 1:1.5 to 1:3. The light of a desired wavelength may be generated based on the ratio between the indium (In) ion intensity of the first peak P11 and the indium (In) ion intensity of the first valley P21.

In the first section S1, the indium (In) ion intensity of the second valley P22 may be lower than the indium (In) ion intensity of the first valley P21. In the second section S2, the third valley P23 may be positioned. The third valley P23 may have the indium (In) ion intensity which may be lower than the indium (In) ion intensity of the second valley P22 and which may be higher than the indium (In) ion intensity than the fourth valley P24. The second section S2 may include the third level Q13 lower than the first level Q11 and higher than the second level Q12 in terms of the concentration of the first dopant.

A difference D22 between the indium (In) ion intensity of the second valley P22, and the indium (In) ion intensity of the third valley P23 may be greater than a difference D21 between the indium (In) ion intensity of the first valley P21, and the indium (In) ion intensity of the second valley P22. For example, the difference D22 between the indium (In) ion intensity of the second valley P22, and the indium (In) ion intensity of the third valley P23 may be 1.5 to 3 times of the difference D21 between the indium (In) ion intensity of the first valley P21, and the indium (In) ion intensity of the second valley P22.

The third section S3 may include the third peak P2 in terms of the indium (In) ion intensity. The indium (In) ion intensity of the third peak P2 may be lower than the indium (In) ion intensity of the second peak P12. In the third section S3, the valley Q21 in terms of the concentration of the first dopant may be positioned.

A difference D12 between the indium (In) ion intensity of the second peak P12, and the indium (In) ion intensity of the third peak P2 may be greater than a difference D11 between the indium (In) ion intensity of the first peak P11, and the indium (In) ion intensity of the second peak P12. For example, the difference D12 between the indium (In) ion intensity of the second peak P12, and the indium (In) ion intensity of the third peak P2 may be 1.5 to 2.5 times larger than the difference D11 between the indium (In) ion intensity of the first peak P11, and the indium (In) ion intensity of the second peak P12.

In the fourth section S4, the plurality of fourth peak P14, and the plurality of fourth valley P24 in terms of the indium (In) ion intensity may be positioned. The indium (In) ion intensity of the fourth peak P14 may be lower than the indium (In) ion intensity of the third peak P2. The indium (In) ion intensity of the fourth valley P24 may be lower than the indium (In) ion intensity of the third valley P23. The fourth valleys P24 may be alternately arranged with the fourth peaks P14. The fourth section S4 may include the second level Q12 lower than the first level Q11, and higher than the third level Q13 in terms of the concentration of the first dopant.

A difference D13 between the indium (In) ion intensity of the third peak P2, and the indium (In) ion intensity of the fourth peak P14 may be equal to or greater than a difference D12 between the indium (In) ion intensity of the second peak P12, and the indium (In) ion intensity of the third peak P2. For example, the difference D13 between the indium (In) ion intensity of the third peak P2, and the indium (In) ion intensity of the fourth peak P14 may be 1 to 1.5 times greater than the difference D12 between the indium (In) ion intensity of the second peak P12, and the indium (In) ion intensity of the third peak P2. In addition, a difference D23 between the indium (In) ion intensity of the third valley P23, and the indium (In) ion intensity of the fourth valley P24 may be smaller than a difference D22 between the indium (In) ion intensity of the second valley P22, and the indium (In) ion intensity of the third valley P23. For example, the difference D23 between the indium (In) ion intensity of the third valley P23, and the indium (In) ion intensity of the fourth valley P24 may be 0.01 to 0.08 times of the difference D22 between the indium (In) ion intensity of the second valley P22, and the indium (In) ion intensity of the third valley P23.

In the fourth section S4, the indium (In) ion intensity is the highest at the point 103. However, the indium (In) ion intensity at the point 103 may be lower than the highest indium (In) ion intensity in each of the first section S1 and the third section S3. Further, the fourth section S4 may include the plurality of fourth peaks P14, thereby to relax the stress between the substrate and a region corresponding to the first section S1. Therefore, a plurality of points corresponding to the fourth peaks P14 may be arranged in the fourth section S4. In one example, two to six points corresponding to the fourth peaks P14 may be arranged in the fourth section S4. When at least two points corresponding to the fourth peaks P14 may be arranged in the fourth section S4, the stress between the substrate and the region corresponding to the first section S1 may be relaxed, and the quality of the thin film may be improved. When the number of points corresponding to the fourth peaks P14 in the fourth section S4 is 6 or smaller, a thickness of the region corresponding to the fourth section S4 may be not too thick, so that the stress between the substrate and the region corresponding to the first section S1 may be relaxed.

The fourth section S4 may correspond to the middle temperature layer. The middle temperature may be a temperature for forming the layer corresponding to the fourth section S4. A growth temperature of the layer corresponding to the fourth section S4 may be lower than a layer corresponding to the region between the fourth point ④ and the substrate or the growth temperature of the layer corresponding to the first section S1. The growth rate in the vertical and horizontal directions may be controlled via adjusting of the temperature during growth of the layer corresponding to the fourth section S4, via the adjustment of the indium (In) content, and via the thickness adjustment of each sub-semiconductor layer (see FIGS. 17a and 17b in FIG. 2), so that the plurality of recess 18 may be easily formed. For example, the recess 18 may have a V-pit shape. In this connection, the vertical direction may refer to the direction toward the surface of the semiconductor structure, while the horizontal direction may be a direction parallel to the surface of the semiconductor structure.

Further, the fourth section S4 may have the second dopant concentration which may be 1.5 to 2.5 times of the second dopant concentration of the section disposed between the fourth point ④ and the substrate. Therefore, a protrusion 150 at which the concentration of the second dopant sharply increases may occur at the fourth point in the spectrum from the SIMS analysis. The first dopant concentration of the fourth section S4 may be lower than the first dopant concentration of the section placed between the fourth point ④ and the substrate. The second dopant concentration of the fourth section S4 may be higher than the second dopant concentration of the section placed between the fourth point ④ and the substrate. Therefore, the electrical resistance of the layer corresponding to the fourth section S4 may be higher than that of the layer corresponding to the section disposed between the fourth point ④ and the substrate, such that the distribution of the first dopants injected into the active layer may be uniform. Further, the spectrum of the second dopant concentration in the fourth section S4 may have the protrusion 150 at the fourth point ④, such that a bottom point of the recess may be positioned in the fourth section S4. Therefore, based on this fact, it may be identified that the recess may be disposed between the fourth point ④ and the first point ①. Accordingly, the light extraction efficiency, and the operation voltage of the semiconductor device may be improved.

In one example, a difference E11 between the first dopant concentrations of the first level Q11 and the second level Q12 may be greater than a difference E12 between the first dopant concentrations of the third level Q13 and the second level Q12. For example, the difference E11 between the first dopant concentrations of the first level Q11 and the second level Q12 may be 10 to 15 times larger than the difference E12 between the first dopant concentrations of the third level Q13 and the second level Q12.

As described above, the first to fourth peaks P11, P12, P2, and P14, and the first to fourth valleys P21, P21, P23, and P24 in terms of the indium (In) ion intensity, and the first to third levels Q11, Q12, and Q13 and the valley Q21 in terms of the concentration of the first dopant as shown in FIG. 8 may be used to define the first to sixth points ① to ⑥. Therefore, based on the SIMS data, not only each layer may be easily identified, but also the distribution of the indium (In) ions or the first dopants in each layer may be easily identified. In addition, the relative thickness of each layer may be easily grasped. As a result, the SIMS data may be used to easily determine whether the semiconductor structure has grown in a desired manner, and thus to form the layer having optimal optical/electrical characteristics, so that a high-quality semiconductor device may be implemented.

As described above, each layer analysis method using the graph according to the third embodiment may allow the plurality of points to be defined using the indium (In) ion intensity, and the first dopant concentration, and thus, allow the plurality of layers to be easily identified based on the defined points.

FOURTH EMBODIMENT

Figure 9:
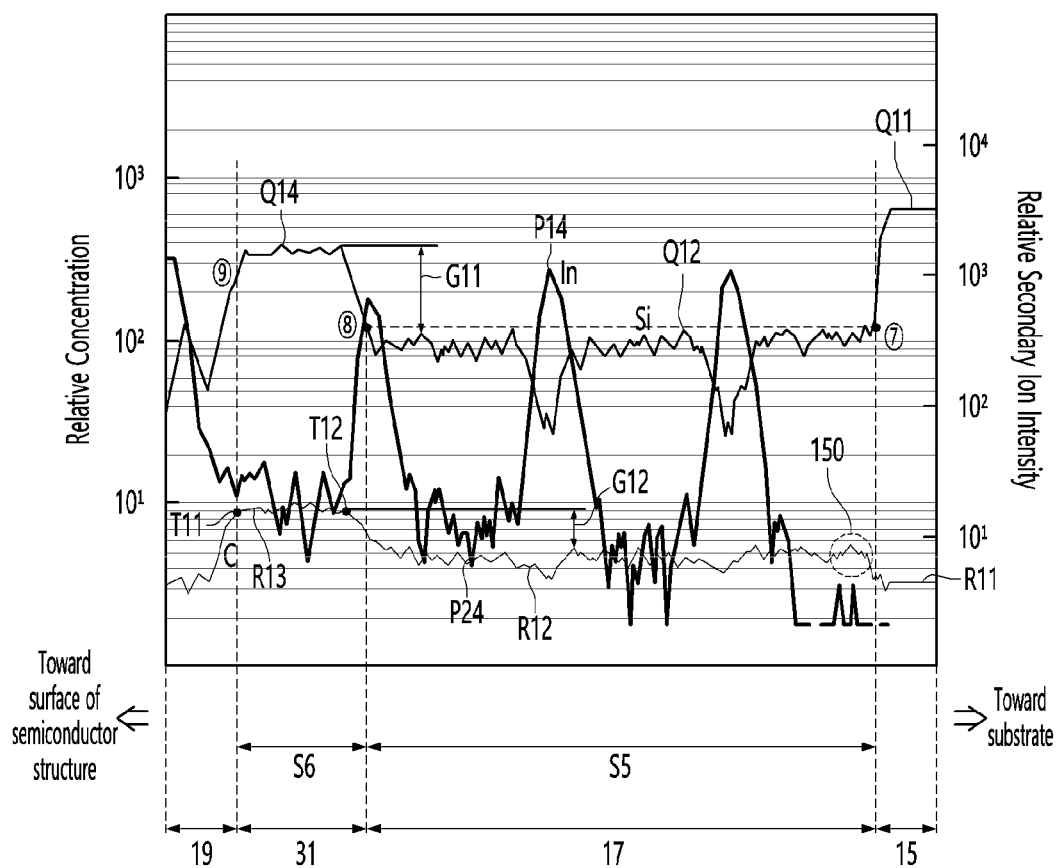
FIG. 9 shows SIMS data for detecting a component of each layer of a semiconductor device according to a fourth embodiment.

FIG. 9 shows SIMS data for detecting a component of each layer of a semiconductor device according to the fourth embodiment.

The fourth embodiment describes the analysis results of secondary ion intensity for detecting a component of each layer of a semiconductor device.

The fourth embodiment is the same as the third embodiment except for a sixth section S6.

Using the SIMS data may allow the secondary ion intensity and/or the doping concentration of a material included in each layer of a semiconductor device to be detected.

As shown in FIG. 9, the first level Q11, the second level Q12, and the fourth level Q14 in terms of the concentration of the first dopant may be shown. Although not shown in FIG. 9, the third level Q13 may be shown in FIG. 8. In addition, as shown in FIG. 9, first to third level R1, R12, and R13 in terms of the concentration of the second dopant may be shown.

The first dopant concentration of the fourth level Q14 may be lower than the first dopant concentration of the first level Q11, and may be higher than the first dopant concentration of the second level Q12. For example, the first dopant concentration of the fourth level Q14 may be 2.5 to 4 times higher than the first dopant concentration of the second level Q12.

The concentration of the second dopant at the second level R12 may be higher than the concentration of the second dopant at the first level R11. For example, the concentration of the second dopant at the second level R12 may be 1.5 to 2 times higher than the concentration of the second dopant at the first level R11. The concentration of the second dopant at the third level R13 may be higher than the concentration of the second dopant at the second level R12. For example, the concentration of the second dopant at the third level R13 may be 2 to 4 times higher than the concentration of the second dopant at the second level R12.

A difference G11 between the first dopant concentration of the fourth level Q14, and the first dopant concentration of the second level Q12 may be greater than a difference G12 between the concentration of the second dopant concentration of the third level R13, and the concentration of the second dopant concentration of the second level R12. The difference G11 between the first dopant concentration of the fourth level Q14, and the first dopant concentration of the second level Q12 may be 25 to 35 times larger than the difference G12 between the concentration of the second dopant concentration of the third level R13, and the concentration of the second dopant concentration of the second level R12.

Seventh to ninth points ⑦ to ⑨ may be defined based on the first level Q11, the second level Q12, and the fourth level Q14 in terms of the concentration of the first dopant, and the first level R11, and the second level R12 in terms of the concentration of the second dopant. In a following description, the first dopant may be silicon (Si), and the second dopant may be carbon (C).

Hereinafter, the definition of the seventh to ninth points ⑦ to ⑨ will be described.

In FIG. 9, the second level Q12 may include plurality of high and low points. The seventh point ⑦ may be disposed adjacent to the substrate 11 and may have the concentration of the first dopant equal to the concentration of the first dopant at the highest point among the plurality of high points of the second level Q12. In addition, the eighth point ⑧ may be disposed adjacent to the surface of the semiconductor structure and may have the concentration of the first dopant equal to the concentration of the first dopant at the highest point among the plurality of high points of the second level Q12.

In FIG. 9, a first inflection point T11, and the second inflection point T12 are present respectively at both ends of the third level R13 in terms of the concentration of the second dopant. From the first inflection point T11, the third level R13 may decrease in the direction toward the surface of the semiconductor structure. From the second inflection point T12, the third level R13 may decrease in a direction toward the substrate 11. In this case, a point on the curve in terms of the concentration of the first dopant at which the curve encounters a vertical line from the first inflection point T11 may be defined as the ninth point ⑨.

Alternatively, the first inflection point T11 may be defined as the ninth point ⑨, and the second inflection point T12 may be defined as the tenth point. In this case, a region between the ninth point ⑨ and the tenth point may be defined as the sixth section S6.

The fifth and sixth sections S5 and S6 may be defined based on the seventh to ninth points ⑦ to ⑨. That is, a region between the seventh point ⑦ and the eighth point ⑧ may be defined as the fifth section S5. A region between the eighth point ⑧ and the ninth point ⑨ may be defined as the sixth section S6.

In the fifth section S5, a plurality of peaks P14, and plurality of valleys P24 in terms of the indium (In) ion intensity may be positioned. The fourth valleys P24 may be alternately arranged with the fourth peaks P14. In the fifth section S5, the first level Q11 and the second level Q12 lower than the fourth level Q14 in terms of the concentration of the first dopant may be positioned. The fifth section S5 may include the second level R12 higher than the first level R11, and lower than the third level R13 in terms of the concentration of the second dopant.

A plurality of high points corresponding to the peaks P14 may be arranged in the fifth section S5. The number of the plurality of high points corresponding to the peaks P14 may be in a range of 2 to 6. When the number of the plurality of high points corresponding to the peaks P14 is 2 or greater, the stress between the substrate and the layer corresponding to the section S of the semiconductor structure may be relaxed, and the quality of the thin film may be improved. When the number of the plurality of high points corresponding to the peaks P14 is 6 or smaller, a thickness of the layer corresponding to the fifth section S5 may be not too thick, so that the stress between the stress between the substrate and the layer corresponding to the section S of the semiconductor structure may be relaxed.

The fifth section S5 may correspond to the middle temperature layer. The middle temperature may be a temperature for forming the layer corresponding to the fifth section S5. A growth temperature of the layer corresponding to the fifth section S5 may be lower than a layer corresponding to the region between the seventh point ⑦ and the substrate. The growth rate in the vertical and horizontal directions may be controlled via adjusting of the temperature during growth of the layer corresponding to the fifth section S5, via the adjustment of the indium (In) content, and via the thickness adjustment of each sub-semiconductor layer (see FIGS. 17a and 17b in FIG. 2), so that the plurality of recess 18 may be easily formed. For example, the recess 18 may have a V-pit shape. In this connection, the vertical direction may refer to the direction toward the surface of the semiconductor structure, while the horizontal direction may be a direction parallel to the surface of the semiconductor structure.

Further, the fifth section S5 may have the second dopant concentration (second level R12) which may be 1.5 to 2.5 times of the second dopant concentration (first level R11) of the layer correspond to the section disposed between the seventh point ⑦ and the substrate. Therefore, a protrusion at which the concentration of the second dopant sharply increases may occur at the seventh point ⑦ in the spectrum from the SIMS analysis. The first dopant concentration (second level Q12) of the fifth section S5 may be lower than the first dopant concentration (first level Q11) of the section placed between the seventh point ⑦ and the substrate. The second dopant concentration (second level R12) of the fifth section S5 may be higher than the second dopant concentration (first level R11) of the section placed between the seventh point ⑦ and the substrate. Therefore, the electrical resistance of the layer corresponding to the fifth section S5 may be higher than that of the layer corresponding to the section disposed between the seventh point ⑦ and the substrate, such that the distribution of the first dopants injected into the active layer may be uniform. Further, the spectrum of the second dopant concentration in the fifth section S5 may have the protrusion at the seventh point ⑦, such that a bottom point of the recess may be positioned in the fifth section S5. Therefore, based on this fact, it may be identified that the arrangement of the recesses may start from the seventh point ⑦. Accordingly, the light extraction efficiency, and the operation voltage of the semiconductor device may be improved.

The sixth section S6 may include a fourth level Q14 lower than the first level Q11, and higher than the second level Q12 in term of the concentration of the first dopant. The sixth section S6 may include a third level R13 higher than the first level R11 and the second level R12 in terms of the concentration of the second dopant.

A first inflection point T11 and a second inflection point T12 may be disposed at both ends of a region corresponding to the third level 13, respectively. The third level R13 of the concentration of the second dopant decreases from the first inflection point T11 in the direction toward the surface of the semiconductor structure. The third level R13 of the concentration of the second dopant decreases from the second inflection point T12 in the direction toward the substrate and then decreases to the second level R12 of the concentration of the second dopant. In addition, the sixth section S6 may include a fourth level Q14 lower than the concentration of the second dopant having the first level Q11, and greater than the concentration of the second dopant having the second level Q12.

As described above, the arrangement of the recesses may start from the seventh point ⑦ of the fifth section S5. In this case, in the sixth section S6, the third level R13 of the concentration of the second dopant is higher than the second level R12 of the concentration of the second dopant, such that the recess may be enlarged at the second inflection point T12. In this way, the recess may be enlarged, such that the luminous intensity may be further increased.

In addition, in the sixth section S6, the fourth level Q14 of the concentration of the first dopant is higher than the second level Q12 of the concentration of the first dopant, such that the electrical resistance is reduced. The electrical resistance may increase due to the increase of the concentration of the second dopant in the sixth section S6. However, the increase in electrical resistance due to the increase in the second dopant may be cancelled by the increase in the concentration of the first dopant therein. This may maintain and improve the electrical and optical characteristics of the semiconductor device.

As above, the seventh to ninth points ⑦ to ⑨ may be defined based on the first level Q11 in terms of the first dopant concentration, the second level Q12 and the fourth level Q14 in terms of the first dopant concentration, and the first level R11 and the second level R12 in terms of the concentration of the second dopant as described above. Each layer, for example, each of the fifth section S5 and the sixth section S7 may be easily identified based on the seventh to ninth points ⑦ to ⑨.

Semiconductor Device Package

Figure 10:
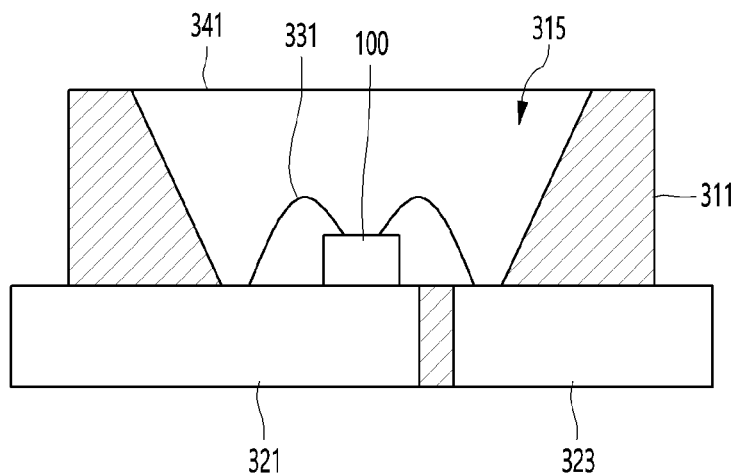
FIG. 10 shows a semiconductor device package according to an embodiment.

FIG. 10 shows a semiconductor device package according to an embodiment.

As shown in FIG. 10, a semiconductor device package according to an embodiment may include a body 311 having a cavity 315, a first lead frame 321 and a second lead frame 323 disposed within the body 311, the semiconductor device 100, wires 331, and a molding member 341.

The body 311 may include a conductive material or an insulating material. The body 311 may be made of at least one of resin material, silicon material, metal material, PSG (photo sensitive glass), sapphire ($Al_2O_3$), and a printed circuit board PCB. The resin material may be PPA (polyphthalamide) or epoxy.

The body 311 has the cavity 315 having an open top. The cavity 315 may include a cup structure or a recess structure that is concave from a top face of the body 311. However, the present disclosure is not limited thereto.

The first lead frame 321 is placed in a first region of a bottom region of the cavity 315. The second lead frame 323 is disposed in a second region of the bottom region of the cavity 315. The first lead frame 321 and the second lead frame 323 may be spaced apart from each other within the cavity 315.

Each of the first and second lead frames 321 and 323 may be made of at least one selected from metal materials, for example, titanium (Ti), copper (Cu), nickel (Ni), gold (Au), chromium (Cr), tantalum (Ta), platinum (Pt), tin (Sn), silver (Ag), and phosphorus (P). Each of the first and second lead frames 321 and 323 may be formed of a single metal layer or a metal multi-layer stack.

The semiconductor device 100 may be disposed on at least one of the first and second lead frames 321 and 223. The semiconductor device 100 may be disposed, for example, on the first lead frame 321 and the wire 331 may be connected to the first and second lead frames 321 and 223.

The semiconductor device 100 may emit light beams in at least two wavelength regions. The semiconductor device 100 may include a group III-V compound semiconductor or a group II-VI compound semiconductor. The semiconductor device 100 may employ the technical features of FIG. 1 to FIG. 9.

The molding member 341 may be disposed in the cavity 315 of the body 311. The molding member 341 may include a translucent resin layer such as silicon or epoxy. The molding member 341 may be formed in a single layer or multiple layers.

The molding member 341 may include a phosphor for changing a wavelength of light emitted from the semiconductor device 100 or may not include the phosphor.

For example, when the semiconductor device according to each of the first embodiment and the second embodiment in which blue light and green light are generated is adopted in the semiconductor device package according to the embodiment, the molding member 341 may include, for example, a red phosphor. Therefore, white light may be rendered via a mixture of the blue light and green light generated from the semiconductor device, and the red light wavelength-converted by the red phosphor included in the molding member.

For example, when the semiconductor device according to each of the third embodiment, a fourth embodiment, and a fifth embodiment, in which all of blue light, green light, and red light are generated, is adopted in the semiconductor device package according to embodiment, the molding member 341 may not include the red phosphor. Even in this case, the molding member may include a phosphor that generates color light other than the red light, when necessary. However, the present disclosure is not limited thereto.

A surface of the molding member 341 may be formed into a flat shape, a concave shape, a convex shape, etc. However, the present disclosure is not limited thereto.

A lens (not shown) may be further formed on a top face of the body 311. The lens may include a concave or/and convex lens structure and may control the light distribution of the light emitted from the semiconductor device 100.

A protective element (not shown) may be disposed in the semiconductor device package. The protection element may be implemented as a thyristor, a Zener diode, or TVS (transient voltage suppression) element.

In one example, the semiconductor device package according to the embodiment may be applied to a light-source device.

Further, the light-source device may include a display, an illumination device, a head lamp, etc. according to an industrial field.

An example of a light-source device may include a display. The display may include a bottom cover, a reflective sheet disposed on the bottom cover, a light-emitting module including a light-emitting element, a light-guide sheet disposed in front of the reflective sheet, and guiding the light emitted from the light-emitting module in a front direction, an optical sheet including prism sheets disposed in front of the light-guide sheet, a display panel disposed in front of the optical sheet, an image signal output circuit connected to the display panel for supplying an image signal to the display panel, and a color filter disposed in front of the display panel. In this connection, the bottom cover, the reflective sheet, the light-emitting module, the light-guide sheet, and the optical sheet may form a backlight unit. Further, the display does not include the color filter. Rather, the display may have a structure in which light-emitting devices for emitting red, green, and blue light beams are disposed, respectively.

Another example of the light-source device may include the head lamp. The head lamp may include a light-emitting module including a semiconductor device package disposed on a substrate, a reflector for reflecting light irradiated from the light-emitting module in a predetermined direction, for example, in a front direction, a lens that refracts light reflected from the reflector in a front direction, and a shade for blocking or reflecting a portion of the light reflected from the reflector toward the lens to form a light-distribution pattern desired by a designer desires.

Another example of the light-source device may include the illumination device. The illumination device may include a cover, a light-source module, a radiator, a power supply, an inner casing, and a socket. Further, the light-source device according to an embodiment may further include at least one of a member and a holder. The light-source module may include the semiconductor device package according to the embodiment.

Features, structures, effects, etc. as described above in the embodiments are included in at least one embodiment, and is not necessarily limited to one embodiment. Furthermore, the features, structures, effects, etc. exemplified in the embodiments may be combined with each other or modified in other embodiments by a person having ordinary knowledge in the field to which the embodiments belong. Therefore, contents related to such combinations, and modifications should be interpreted as being included in the range of the disclosure.

The embodiment has been mainly described, but this is merely an example, and does not limit the present disclosure. Those of ordinary skill in the field to which the embodiment belongs will find that various modifications, and applications as not exemplified above are possible within a range that does not depart from the essential characteristics of the present disclosure. For example, each component specifically shown in the embodiment may be modified. In addition, variations related to the modifications and applications should be interpreted as being included in the range of the disclosure set in the attached claims.

The embodiments may be applied to a semiconductor device, and to a field related thereto.

What is claimed is:

1. A semiconductor device comprising:
a first conductive-type semiconductor layer;
a second conductive-type semiconductor layer on the first conductive-type semiconductor layer; and
an active layer disposed between the first conductive-type semiconductor layer and the second conductive-type semiconductor layer,
wherein when primary ions are irradiated to the first conductive-type semiconductor layer, the active layer, and the second conductive-type semiconductor layer, secondary ions are emitted from the first conductive-type semiconductor layer, the active layer, and the second conductive-type semiconductor layer, wherein an indium (In) ion intensity, a silicon (Si) concentration, and a carbon (C) concentration of the first conductive-type semiconductor layer, the active layer, and the second conductive-type semiconductor layer are detected based on the emitted secondary ions,
wherein the semiconductor device has a plurality of inflection points of the indium (In) ion intensity, wherein the indium (In) ion intensities at the plurality of inflection points are 0.3 to 0.5 times of a highest indium (In) ion intensity in a vertical entire region of the semiconductor device,
wherein the semiconductor device has:
a first point having the same indium (In) ion intensity as a lowest indium (In) ion intensity among the indium (In) ion intensities at the plurality of inflection points, wherein the first point is adjacent to a location having a lowest indium (In) ion intensity in a direction toward a first vertical end of the semiconductor device;
a second point having the same indium (In) ion intensity as a lowest indium (In) ion intensity among the indium (In) ion intensities at the plurality of inflection points, wherein the second point is closest to a location having a lowest indium (In) ion intensity in a direction toward a second vertical end of the semiconductor device, wherein the first and second vertical ends are opposite to each other;
a third point having the same indium (In) ion intensity as an indium (In) ion intensity of a highest peak among at least one peak, wherein at least one point having the at least one peak respectively is spaced from the second point in a direction toward the second vertical end, wherein the third point is closest to a location having a peak of a highest indium (In) ion intensity in a direction toward the first vertical end of the semiconductor device; and
a fourth point present in a partial region where the Si concentration is lower than a highest Si concentration in a vertical entire region of the semiconductor device, wherein the fourth point has a highest Si concentration in the partial region, wherein the fourth point is adjacent to a location having a highest Si concentration in a direction toward the second vertical end of the semiconductor device,
wherein the active layer corresponds to a first region between the first point and the second point,
wherein the first conductive-type semiconductor layer includes a first layer and a second layer,
wherein the first layer corresponds to a second region containing a point having a highest Si concentration,
wherein the second layer corresponds to a third region between the third point and the fourth point, wherein the C concentration in the third region is higher than the C concentration in the second region, and
wherein the Si concentration in the second region is higher than the Si concentration in the third region.

2. The semiconductor device of claim 1, wherein the first region includes a plurality of first peaks, and a plurality of second peaks lower than the first peaks in terms of the indium (In) ion intensity,
wherein the first region includes a plurality of first valleys, and a plurality of second valleys lower than the first valleys in terms of the indium (In) ion intensity,
wherein the first valleys are alternately arranged with the first peaks, and
wherein the second valleys are alternately arranged with the second peaks.

3. The semiconductor device of claim 2, wherein the third region includes a plurality of third peaks, and a plurality of third valleys in terms of the indium (In) ion intensity, and wherein the third valleys are alternately arranged with the third peaks.

4. The semiconductor device of claim 3, wherein the semiconductor device further has:
a fifth point having the same Si concentration as a highest Si concentration in the third region, wherein the fifth point is adjacent to a location having a highest Si concentration in a direction toward the first vertical end of the semiconductor device; and
a sixth point having the same Si concentration as a highest Si concentration in the third region, wherein the sixth point is adjacent to the fifth point in a direction toward the first vertical end of the semiconductor device,
wherein the first conductive-type semiconductor layer further includes a third layer, and a fourth layer,
wherein the third layer corresponds to a fourth region between the third point and the sixth point, and
wherein the fourth layer corresponds to a fifth region between the fifth point and the sixth point.

5. The semiconductor device of claim 4, wherein the fourth region includes a fourth peak in terms of the indium (In) ion intensity, and a fourth valley in terms of the Si concentration,
wherein the indium (In) ion intensity of the fourth peak is lower than the indium (In) ion intensity of the second peak, and
wherein a highest indium (In) ion intensity in the third region is lower than a highest indium (In) ion intensity in the fourth region.

6. The semiconductor device of claim 5, wherein a difference between the indium (In) ion intensity of the second peak and the indium (In) ion intensity of the fourth peak is 1.5 to 2.5 times larger than a difference between the indium (In) ion intensity of the first peak and the indium (In) ion intensity of the second peak.

7. The semiconductor device of claim 6, wherein a difference between the indium (In) ion intensity of the fourth peak and the indium (In) ion intensity of the third peak is 1 to 1.5 times larger than a difference between the indium (In) ion intensity of the second peak and the indium (In) ion intensity of the fourth peak.

8. The semiconductor device of claim 4, wherein the fifth region includes a fifth valley, and
   wherein a difference between the indium (In) ion intensity of the fifth valley and the indium (In) ion intensity of the third valley is 0.01 to 0.08 times of a difference between the indium (In) ion intensity of the second valley and the indium (In) ion intensity of the fifth valley.

9. The semiconductor device of claim 4, wherein the fifth region includes:
   a fifth valley having the indium (In) ion intensity higher than the indium (In) ion intensity of the third valley; and
   a third level of the Si concentration lower than a first level of the Si concentration in the second region, and higher than a second level of the Si concentration in the third region.

* * * * *